United States Patent [19]
Fukuda et al.

[11] Patent Number: 6,099,574
[45] Date of Patent: Aug. 8, 2000

[54] METHOD AND APPARATUS FOR OBTAINING STRUCTURE OF SEMICONDUCTOR DEVICES AND MEMORY FOR STORING PROGRAM FOR OBTAINING THE SAME

[75] Inventors: Sanae Fukuda; Hirotaka Amakawa, both of Tokyo; Takahisa Kanemura, Tokoy, all of Japan

[73] Assignee: Kabushiki Kaisha Toshiba, Kawasaki, Japan

[21] Appl. No.: 08/991,406

[22] Filed: Dec. 16, 1997

[30] Foreign Application Priority Data

Dec. 19, 1996 [JP] Japan .................................. 8-339935

[51] Int. Cl.[7] .................................................. G06F 9/455
[52] U.S. Cl. ................................................................ 703/14
[58] Field of Search ...................... 395/500.21, 500.34, 395/500.35, 500.25, 500.27; 257/51

[56] References Cited

U.S. PATENT DOCUMENTS

| | | | |
|---|---|---|---|
| 5,468,974 | 11/1995 | Aronowitz et al. | 257/51 |
| 5,684,723 | 11/1997 | Nakadai | 364/578 |
| 5,859,784 | 11/1999 | Sawahata | 364/578 |
| 5,886,906 | 3/1999 | Tatsumi et al. | 395/500.27 |

OTHER PUBLICATIONS

Lee and Chung, Simulation of Three–Dimensional Stop–Ion and Deposited Energy Distributions in Amorphous Chalcogenide Resist Film by Ga Ion Exposure, May 1995, pp. 572–575.

*Primary Examiner*—Kevin J. Teska
*Assistant Examiner*—Dan Fiul
*Attorney, Agent, or Firm*—Foley & Lardner

[57] ABSTRACT

Process simulation for LSIs and other semiconductor devices will handle plural same impurities introduced in different processes as different impurities. Thus, by handling them as different impurities in calculation, it is possible to obtain the distribution profiles of impurities in semiconductor devices without being effected by another same impurity introduced in another process or a number of processes during processing. With this, even a plurality of process conditions are discussed or when one or some of process(es) in a sequence of semiconductor device fabrication processes is (are) changed in procedure, it is not necessary to repeat the process simulation many times from the beginning. And it is possible to easily decide which process must be changed in conditions based on a finally obtained structure of semiconductor devices. The process simulation results are used directly as input to device simulation, to rapidly obtain performance of semiconductor devices such as current vs voltage characteristics. Therefore, the efficiency of calculations required to obtain the optimal conditions for semiconductor structures can be improved, thus shortening the lapse of time for designing and development of semiconductor devices.

29 Claims, 18 Drawing Sheets

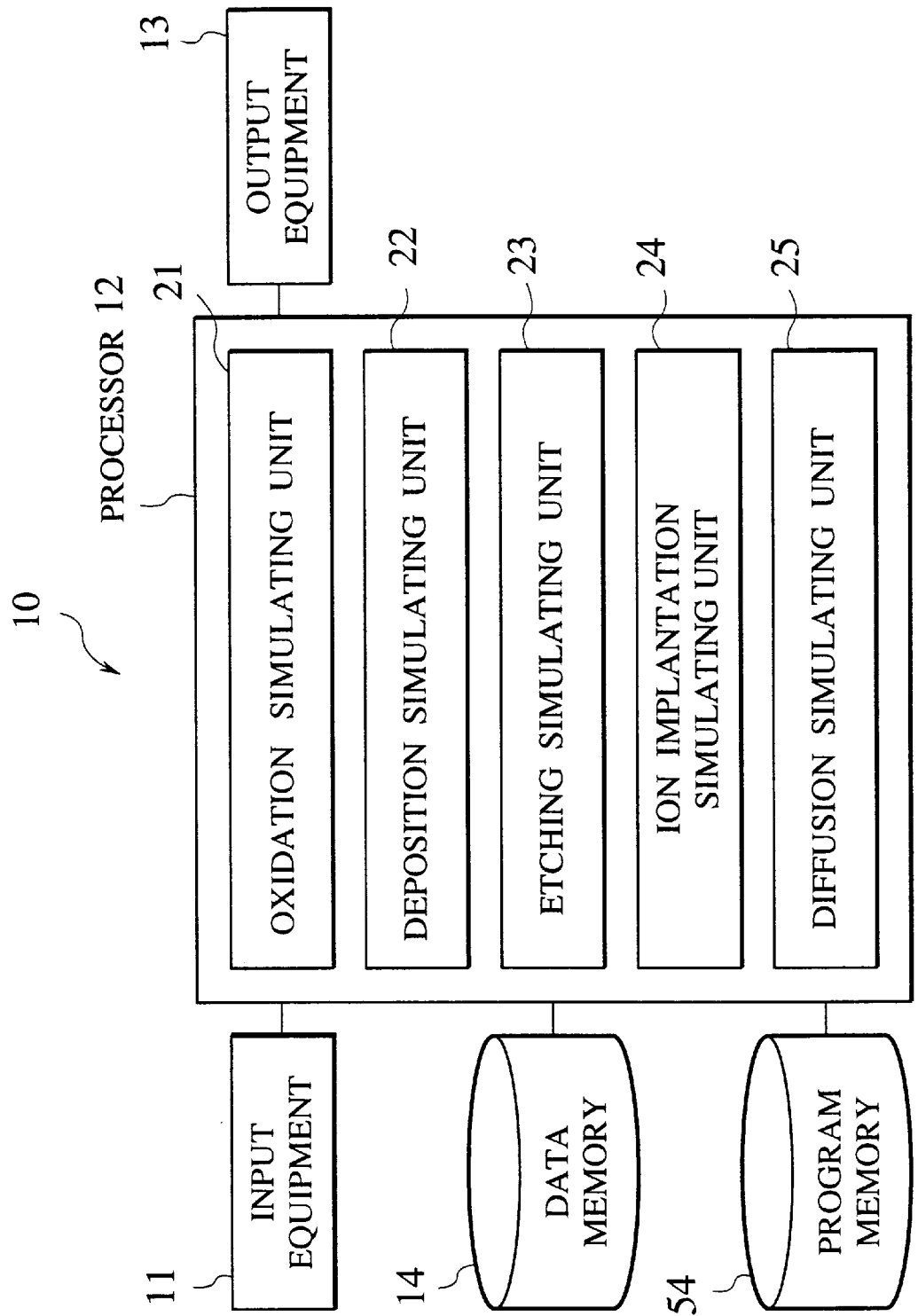

FIG.8

- n-SUB  n=1×10$^{15}$cm$^{-3}$ (PHOS)
- Si$_3$N$_4$ PATTERN FORMATION
- CHANNEL-STOP BORON (B1) I/I 100keV 1×10$^{13}$cm$^{-2}$
- LOCOS T$_{OX}$ 600nm
- Si$_3$N$_4$ STRIPPING
- p-WELL BORON (B2) I/I 160keV 5×10$^{12}$cm$^{-3}$
- p-WELL DRIVE-IN
- DUMMY OXIDATION T$_{OX}$ 10nm
- Vth CONTROL I/I
  BORON (B3) 10keV 7×10$^{12}$cm$^{-2}$
- PUNCH-THROUGH PROTECTION I/I
  BORON (B4) 80keV 5×10$^{12}$cm$^{-2}$
- DUMMY OXIDE-FILM STRIPPING/GATE OXIDATION T$_{OX}$ 10nm
- POLY-Si CVD / GATE PATTERNING
- POST-OXIDATION
- S/D I/I ARSENIC (As) 30keV 5×10$^{15}$cm$^{-2}$
- SiO$_2$ CVD
- S/D ACTIVATION ANNEAL
- CONTACT HOLE
- METALIZATION 0.2um

As2　As2'　As1

DISTRIBUTION PROFILE OF As2

METHOD AND APPARATUS FOR OBTAINING STRUCTURE OF SEMICONDUCTOR DEVICES AND MEMORY FOR STORING PROGRAM FOR OBTAINING THE SAME

BACKGROUND OF THE INVENTION

1. Field of the Invention

The present invention relates to semiconductor simulation required in designing and development of semiconductor devices including Large Scale Integrations (LSIs). The present invention relates more specifically to a method and an apparatus for carrying out process simulation to obtain the geometry of semiconductor devices as well as the distribution profiles of impurities and defects in those devices. And the present invention also relates to a method and an apparatus for obtaining device simulation to obtain the electrical characteristics etc. of semiconductor devices based on the output of such process simulation apparatus. Moreover, the present invention relates to a computer memory medium which stores programs for use in such simulation. The present invention relates more specifically to a technology which, in such process simulation and device simulation, easily specifies processes to be optimized, thereby obtaining the optimal conditions for such semiconductor devices.

2. Description of the Related Art

In the design and development of semiconductor devices, conventionally, to decide fabrication processes to realize such semiconductor devices as to meet desired electrical characteristics, a process simulator (process simulation apparatus) and a device simulator (device simulation apparatus) have been employed. The process simulator simulates the process of fabricating those semiconductor devices in order to obtain the geometry of hose devices and the distribution profile of impurities in hose devices. The device simulator simulates the electrical characteristics of those devices.

Actually, first, an appropriate structure of a semiconductor device is roughly selected and designed against prescribed characteristics specifications. Then, process simulation is carried out to realize thus outlined device structure. This process simulation employs a process simulator in such a way that the simulator receives as an input the materials and their fabrication procedure as well as its respective processes conditions, to work out the resultant structure of the semiconductor device. Next, device simulation is carried out by a device simulator employing the obtained structure by the process simulation. In the device simulation, electrical conditions to be applied on the semiconductor device externally are also entered to the device simulator, to obtain the electrical characteristics of the semiconductor device. Thus obtained electrical characteristics are checked on whether they meet the desired conditions. If they do, fabrication processes start to fabricate actual devices. If they don't and therefore it is decided that the original fabrication processes are not appropriate to fabricate a desired device, the fabrication process conditions or the process order are changed, to carry out process simulation again and enter the process simulation results to a device simulator for device simulation. This step is repeated until device fabrication processes are obtained which meet the desired characteristics, to decide appropriate fabrication processes.

To design and develop a semiconductor device by use of such process simulation and device simulation, it is necessary for engineers to work out a better procedure and conditions if fabrication procedure and conditions previously selected as an input to a process simulator are decided not to meet the desired specifications. However, the fabrication of the fine-patterned elements of recent LSIs requires few hundreds of process steps, and various impurities are introduced into the semiconductor layers or overlying thin films. Moreover, a final device structure is obtained after many heat treatment steps during the sequence of these process steps. With this, it is difficult to decide which ones of those process steps should be changed to obtain the desired structure based on such obtained final device structure.

Also, if the process simulator could output exactly the same structure as an actually fabricated semiconductor device and, likewise, the device simulator could calculate exactly the same characteristics as those in the case of actual voltage application, those two types of simulation alone would decide a method of fabricating a desired semiconductor device. However, these simulations are limited in what they can do alone. Actually, there are a lot of problems yet to be made clear such as chemical changes in materials during fabrication. Further, there are many fabrication conditions that cannot be controlled by the fabrication equipment. Those problems have significant effects on the device structure during fabrication, and the process simulation will not provide in all cases the same device structure as actual ones. In device simulation, also, the factors determining the electron behavior in the semiconductor and other physical phenomenon during application of voltage on the semiconductor device are not made clear yet, so that the characteristics assumed by device simulation do not always coincide with actual ones. Moreover, calculations must be executed within a reasonable time lapse by use of computer resources which are available easily as tools for design and development. That is, if simulation by use of such computer resources requires a longer time than that for actual trial fabrication of semiconductor devices, it is almost useless. To execute necessary calculations within a short lapse of time, it is impossible to calculate all structures or device behaviors, etc. from the first principle of nature within the simulators. Hence, model equations must be used in calculation of these structures and device behaviors, which incorporate parameters realizing the approximate realities. With these, a semiconductor device obtained by use of process simulation and device simulation do not always provide exactly the same characteristics as the actual one.

If a structure of a semiconductor device obtained by a process simulation has one or a plurality of unsuitable portions of its own, such as different structure from that of an actual one which will have significant effects on the device performance, it is not so much of use to enter thus obtained structure into the device simulator to obtain the electrical characteristics. To solve this problem, it will be necessary in such simulation to use the past data or actual measurements on a trial-fabricated structures so as to correct those unsuitable portions obtained by the simulator—if these unsuitable portions are known beforehand—which are different from the actual ones. Or it may also necessary to use some knowledge to bridge the gap between the realities and simulation results. For example, it may be appropriate to use a simulator as an auxiliary tool to decide the processes of fabricating desired semiconductor devices. Thus, it is effective to carry out device simulation after partially correcting the results of the process simulation employing such past data and actual measurements. Conventional process simulation, however, provides two-dimensional or three-dimensional structures (profiles), so that it has been extremely difficult to edit the unsuitable part of device geometry or distribution of internal impurities. And it has also been difficult to provide some tools for editing the unsuitable portions. Also, even if processes to be changed are known beforehand, in order to carry out simulation with some changed conditions, it has been necessary to perform calculations as many times as the number of the conditions of the concerned processes. Namely, at least the subsequent process after the changed condition must be calculated, which covers exact electrical characteristics, even if a rough range of conditions is required. Hence, the change of condition in the prior art wasted a lot of manpower and calculation time.

FIG. 1 is a flowchart of a processing procedure for conventional process simulation to predict a final distribution profile of impurities of a semiconductor device when the energy of implanting ions of boron ($^{11}B^+$) is changed to form a p-type base region of an npn bipolar transistor. The conventional process simulation shown in FIG. 1 comprises the time-series steps of:

(a) First, antimony ($^{122}Sb^+$) is used as an impurity for the deeply lying high-concentration portion and, for the near-substrate surface level (rather shallowly lying) portion, phosphorus ($^{31}P^+$) ions are implanted and then the device undergoes heat treatment, so that calculation is performed on the diffusion of impurities involved in the process of forming n-type collection regions;

(b) To form p-type base regions, after the n-type ones are formed, boron ($^{11}B^+$) ions are implanted. Here, simulation is carried out on three conditions of boron ($^{11}B^+$) ion acceleration energy levels 50 keV, 60 keV, and 70 keV, after which the condition for optimal impurity profile is given, as an example. Firstly, the case that boron ($^{11}B^+$) ions are implanted with 50 keV and annealed for the activation of the implanted boron ($^{11}B^+$) ions which accompany an impurity diffusion is calculated;

(c) Then, arsenic ($^{75}As^+$) ions are implanted to form n-type emitter regions. And impurity diffusion involved in such subsequent various heat treatment processes as emitter activation, formation of inter-layer insulator films/passivation films, and metalization is calculated. Then, as shown in FIG. 2, a final impurity distribution profile of npn bipolar transistors for the acceleration energy of 50 keV (N=1) of $^{11}B^+$ is obtained;

(d) The same calculation is performed in the case where the acceleration energy is set at 60 keV to form base regions again (N=2);

(e) The same calculation is performed in the case where the acceleration energy is set at 70 keV (N=3); and (f) When three final structure profiles against those three ion implantation energy levels are provided, the corresponding impurity distribution profiles are compared to each other, to decide the optimal condition.

The above-mentioned calculation procedure is more specifically described with respect to the flowchart shown in FIG. 1. First, the counter value N, which indicates the number of times of simulations carried out, is set to 0 (step 101), to increase N (step 102). Next, as a pre-process, the conditions for implanting antimony ($^{122}Sb^+$) and phosphorus ($^{31}P^+$) ions to form n-type collector regions are read out from, for example, the data memory, to calculate impurity diffusion profile based on those ion implantation dosages Q, projected ranges Rp, standard deviations $\Delta$Rp of the projected ranges, and other prescribed boundary conditions as well as heat treatment conditions etc. (step 103). As a result, one-dimensional impurity distribution profile such as shown in FIG. 3 is obtained.

Subsequently, for ion implantation of boron ($^{11}B^+$) performed as one step of p-type base region formation, the N'th ion implantation condition is read out from the data memory (step 104). Based on the corresponding dosages Q, projected ranges Rp, and other ion implantation conditions of $^{11}B^+$ and also heat treatment conditions, impurity diffusion is calculated to simulate boron ion implantation (step 105). Here, N=1, 2, and 3 represent acceleration energy levels of 50 keV, 60 keV, and 70 keV respectively.

Next, as a post-process, the condition for arsenic ($^{75}As^+$) ion implantation to form n-type emitter regions is read out from the data memory. Based on the boundary condition of $^{75}As^+$ ion implantation such as the corresponding dosages Q and projected ranges Rp, as well as the annealing conditions of the post-implantation emitter activation, inter-layer insulator film/passivation film formation, metalization, etc., impurity diffusion is calculated (step 106).

Then, the results are output (step 107). Subsequently, it is decided whether N=3 (step 108). If N is not 3, a return is made to step 102; and if it is 3, the processing is terminated.

In process simulation for semiconductor devices, a diffusion simulation takes a major part of calculation time. In the above-mentioned example, impurity diffusion after ion implantation is numerically solved by using a diffusion equation. Generally, this "diffusion simulation" creates meshes to form discrete expressions that approximate continuity equations which describe the diffusion phenomena in semiconductor, to solve the simultaneous non-linear partial differentiation equation repetitively in a time-evolution manner. To raise a simulation accuracy, a time interval for each time loop for repetitive calculation $\Delta t$ must be set small to some extent, thus requiring a lot of time in diffusion simulation. As compared to diffusion simulation, "geometry simulation" generally takes a short time to terminate which obtains the changes in geometry of oxide film edges—such as the bird's-beak geometry—during LOCOS and the geometry of gate electrodes, various wiring films, trenches in semiconductor devices. A process simulator is a collection of single-process simulators for ion implantation, oxidization, diffusion, deposition, and etching processes. According to the flowchart down in FIG. 1, a series of process simulation steps which combines a number of single-process simulators in a complicated manner are calculated repetitively each time a part thereof is changed. That is, in the flowchart for conventional simulation shown in FIG. 1, to perform calculation as to three ion implantation conditions for p-type base region, time-consuming diffusion simulation comprising a series of calculations must be three times carried out from the beginning, for each of four elements (arsenic, boron, phosphorus, and antimony).

More simply describing, since there are to be carried out a total of three heat treatment for antimony ($^{122}Sb^+$) and phosphorus ($^{31}P^+$) ions: first heat treatment of immediately after the implantation of antimony ($^{122}Sb^+$) and phosphorus ($^{31}P^+$) ions; second heat treatment after boron ($^{11}B^+$) implantation; and third heat treatment after arsenic ($^{75}As^+$) implantation, it is necessary to perform diffusion simulation for antimony ($^{122}Sb^+$) and phosphorus ($^{31}P^+$) ions three times corresponding to those three heat treatment processes. Here, each of emitter activation after arsenic ($^{75}As^+$) ion implantation, inter-layer insulator-film formation, passivation-film formation, and metalization is counted as one heat treatment process. For boron ($^{11}B^+$) ions, diffusion simulation must be performed two times; once for heat treatment immediately after the boron ($^{11}B^+$) ion implantation and another for that after arsenic ($^{75}$As$^+$) ion implantation. And for the arsenic ($^{75}$As$^+$) ions, one diffusion simulation must be performed corresponding to one heat treatment just after the arsenic ($^{75}$As$^+$) ion implantation. That is, for each of boron ($^{11}$B$^+$) ion implantation conditions, nine (=2×3+2+1) times of calculations must be carried out, so that for three boron ($^{11}$B$^+$) ion implantation conditions, a total of 27 (=3×9) times of calculations must be carried out.

The flowchart shown in FIG. 1 is the simplest one that focuses on only the ion implantation process for discrete npn bipolar transistors, while actual fabrication of LSIs is complicated, requiring several tens to several hundreds of processes. In order to optimize the manufacturing procedure and the process conditions for fabricating LSIs, it is necessary to first specify some processes, among a large number of fabrication processes, which seem to improve the device characteristics. However, to change the conditions for each of thus specified processes, a series of simulations must be repeated from the beginning according to the prior art. Therefore, even when the process conditions to be changed have little effects on materials introduced in other processes, calculation must be performed for all processes after the conditions are changed, resulting in a longer calculation time, higher calculation costs, and a lot of manpower.

As mentioned above, diffusion simulation in semiconductor to obtain impurity or defect-density profiles requires calculations which take the longest time than any other semiconductor process simulations. Then, according to the prior art, longer calculation times, higher costs, and larger manpowers are required because it is necessary to perform calculations from the beginning each time a part of the ion implantation conditions are changed. Moreover, diffusion simulation needs to set the time interval for each time loop for repetitive calculations Δt at a small value to achieve a highly accurate calculation, and even a super-computer can take two hours of its CPU time to perform even 0.07 minute of heat treatment time, for example. That is, highly accurate process simulation takes even longer time of calculations than a actual trial fabrication of LSIs, resulting in being useless in simulation.

SUMMARY OF THE INVENTION

To solve the above-mentioned problems, an object of the present invention is to provide a method of process simulation for obtaining the distribution profile of impurities and defects in semiconductor devices with improved efficiency of calculation, thus obtaining the optimal conditions among various process conditions for LSI fabrication processes.

An another object of the present invention is to provide a method which will shorten the overall time required for process simulation by reducing as much as possible the number of times of carrying out diffusion simulation on impurities etc. in semiconductor devices, which tends to elongate calculation time.

A further object of the present invention is to provide, as a whole, a high-accuracy process simulation by reducing as much as possible the number of times of carrying out diffusion simulation on impurities in semiconductor devices to essentially secure a calculation time for realizing a higher accuracy diffusion simulation.

A still further object of the present invention is to provide a method of semiconductor simulation which facilitates device simulation employing as an input the results of process simulation whose execution time has been shortened.

An additional object of the present invention is to provide a higher accuracy process simulation, thus simultaneously raising the accuracy of device simulation employing the results of this process simulation.

An additional object of the present invention is to provide a semiconductor process simulation apparatus which improves the efficiency of calculations required to obtain the profiles of impurities and defects in semiconductor devices, to enable design and development of those devices in a short period of time.

An additional object of the present invention is to provide an even highly efficient and accurate semiconductor simulation apparatus which is so configured as to comprise at least a timesaving process simulation apparatus and a device simulation apparatus which receives as an input the output of this process simulation apparatus.

An additional object of the present invention is to provide a memory medium which stores simulation programs, that can be read out by a computer, for timesaving calculation to obtain the optimal conditions for fabrication of semiconductor devices, thereby enabling the design and development of those semiconductor devices in a short period of time.

In order to accomplish the objects, a first feature of the present invention lies in a semiconductor simulation method including a simulation (first simulation) to obtain the distribution profiles of materials such as impurities and defects in semiconductor devices. The first simulation of the first feature comprises the steps of: setting a plurality of materials in the semiconductor device so that, even a same material is introduced in a certain step as material introduced in another process, the material introduced in the certain process is handled as being different from the material introduced in this another step; and handling the plurality of materials mutually independently, to obtain distribution profiles of those materials in semiconductor devices. Of course, this semiconductor simulation may comprise a second simulation which obtains the geometry of the semiconductor device. The geometry includes the irregularities, U grooves, V grooves, trenches in the semiconductor substrates or cross-sectional shapes of the insulator and wiring films formed on those substrates.

According to the first feature of the present invention, materials introduced by ion implantation etc. into semiconductor devices are handled mutually independently even if there is same material as that introduced in another step, so that the final results of process simulation will provide the distribution profiles for each of those materials, free from the effects by the same material introduced in any other steps or a number of steps during the processing. Therefore, without requiring to repeat process simulation a number of times nor to carry out a simulation with a different order of processes, it is easy to decide, based on thus obtained final device structure, which step among a series of steps must be changed in the condition.

The data including the distribution profiles of impurities and defects in semiconductor devices as a result of the first simulation of this first feature is directly entered to a third simulation, by which should preferably be obtained the device behaviors such as current vs. voltage characteristics. A higher speed and a higher accuracy of the first simulation would give the electrical characteristics of semiconductor devices rapidly and accurately.

Those materials introduced in semiconductor devices include impurity atoms in those devices and point defects which generated in those devices. By handling those impurity atoms and/or point defects in semiconductor devices as different materials, it is possible to obtain the impurity (or defect) distribution profile and the device structure after a sequence of the fabrication processes comprising various processes such as deposition processes including CVD, epitaxial growth evaporation and sputtering, etching processes such as RIE, ion implantation process, oxidation process, and diffusion process such as predeposition and drive-in.

According to the first feature of the present invention, when process simulation has been completed for a first sequence of process pertaining to only one condition, such process simulation on a second sequence of process in which a prescribed single process is changed can be replaced by an operation in which the spatial distribution of the concerned material obtained for the first sequence is multiplied by a constant value. Thus, by multiplying the already obtained final results on one condition by a constant value to replace the process simulation results on other conditions, it is possible to obtain desired results on plural sequences of process with various conditions easily without repeating from the beginning the entire sequence of process on each of the different conditions as to a single process.

In the first feature of the present invention, identification information to indicate in which process the concerned materials have been introduced in semiconductor devices should preferably be added so that, based on this information, the process in which the specified materials were introduced can be specified after the spatial distribution profiles of all the materials introduced were output. Here, the identification information added for each material may come in, for example, a symbol, number, and name which indicate an introduction processes. When one material is specified after the spatial distribution profiles of all materials handled as different ones were output, the process where that material was introduced can be specified on the basis of the identification information added to that material, to easily identify any processes whose conditions must be changed if finally obtained spatial distribution profiles were decided not to provide desirable characteristics.

Also, it is permitted to rewrite only the spatial distribution of a specified particular material after the spatial distribution profiles of all materials introduced in semiconductor devices. By thus rewriting only the spatial distribution of a specified particular material, if the results of one material out of spatial distribution profiles obtained by process simulation do not match actual measurements, for example, it is possible to correct the spatial distribution of the concerned material, to start promptly the next device simulation work without performing the same process simulation again on different conditions.

Also, in a process of introducing a material such as impurities in semiconductor devices, the concerned material should preferably be provided with identification information which indicates mask pattern or their pattern openings used when the concerned material was introduced so that, after the spatial distribution profiles of all materials introduced were output, those mask patterns or their mask openings with which the specified material was introduced can be identified on the basis of this identification information. If one material is specified after the spatial distribution profiles of the materials handled as mutually different ones are output, the identification information added to that material can be used to specify the mask pattern or its pattern openings used for introduction of that material in order to easily tell which mask patterns or pattern opening should be modified.

According to the first feature of the present invention, after the spatial distribution profiles of all materials introduced in semiconductor devices are output, the position of a specified material may be moved parallel to a specified position. Parallel movement here includes movement in a horizontal direction, perpendicular direction, and oblique direction. Thus, by moving the spatial distribution output of each material to a specified position in a parallel direction, a spatial distribution in the case where for example a mask pattern is shifted laterally can be easily obtained without performing calculations again. In this case, when a specified material position is moved parallel, the point where the concerned material did not exist before parallel movement should preferably be extrapolated or interpolated. Thus, notch lines or blanks which occurs where a material did not exist before its spatial distribution was moved parallel can be extrapolated or interpolated, so that it is possible to modify that portion's distribution into a normal profile without rewriting the spatial distribution by recalculation. More preferably, after the spatial distribution profiles of all materials introduced in semiconductor devices are output, the spatial distribution of a specified material should be represented by position coordinates functions $C(x)$, $C(x, y)$, based on which this spatial distribution can be edited. Those functions $C(x)$, $C(x, y)$ may come in a Gaussian distribution function or a complementary error function. Thus, by converting the spatial distribution of a material into position coordinates functions $C(x)$, $C(x, y)$ and, based on those functions, editing the spatial distribution, it is possible to easily rewrite, move parallel, extrapolate, and interpolate the above-mentioned spatial distribution.

Also, according to the first feature of the present invention, different material constants or parameters may be assigned to the plural same materials set to be handled as mutually different one. If, for example, the plural same materials set to be handled as different materials are impurity atoms, independent activation ratios, diffusion coefficients, mobilities, and other material constants or parameters can be assigned to the impurity atoms, respectively. Alternatively, the plural same materials set as being handled as a plurality of different materials may be treated independently in terms of the model equations which control the respective behaviors of the concerned materials. In these ways, the complicated behavior of semiconductor devices can be simulated even more accurately by performing process simulation more accurately for obtaining the distribution profiles of introduced impurities as well as device simulation for receiving the results of the process simulation.

A second feature of the present invention pertains to a semiconductor simulation method which includes the simulation (first simulation) of obtaining the distribution profiles of impurities or defects in semiconductor devices in semiconductor simulation. Namely, the second feature lies in the first simulation comprising the steps of: (a) setting same materials to be introduced under the different conditions in a prescribed process is set as being handled as different materials in calculation in this prescribed process; (b) handling these same materials mutually independently to obtain distribution profile of the same materials. Even when more than one condition were set for same materials in the prescribed process, the same materials are handled as different materials, respectively, and only a single calculation accomplishing a sequence of process including the prescribed process is enough to obtain the distribution profile of the materials. On the contrary, the conventional approach requires plural sequences of calculations, each corresponds to one of conditions of the materials to be introduced. For example, suppose that there are provided three conditions for implanting impurity ions to be introduced in semiconductor devices. The conventional approach must perform simulation three times for the different conditions, whereas according to the second feature of the present invention, those three independent conditions can be set simultaneously, so that simulation has to be performed only once to obtain the necessary results, reducing the number of simulation times by two. The semiconductor simulation of the second feature can of course comprise the second simulation of obtaining pattern transferred and cross-sectional view of the insulator films on a semiconductor substrate and the trench geometry formed in the substrate, etc.

The results thus obtained by the first simulation according to the second feature of the present invention, i.e. the data including the distribution profiles of impurities and defects in semiconductor devices should preferably be entered directly to a third simulation, where device behaviors such as current vs. voltage characteristics can be obtained. The high-speed and high-accuracy first simulation enables it to obtain electrical characteristics etc. of semiconductor devices rapidly and highly accurately.

A third feature of the present invention pertains to a semiconductor simulation apparatus including a first simulator which calculates a sequence of processes related to the fabrication of semiconductor devices. Namely, the third feature lies in the first simulator comprising a material profile obtaining unit whereby, even if a material introduced in semiconductor devices in some process is the same as that introduced in another process, these same materials are handled as being mutually different materials. By a simulation apparatus according to the third feature of the present invention, the same materials introduced in semiconductor devices are discriminated independently in different processes, so that the final results of process simulation will tell the independent distribution profiles of each material without being affected by another same material introduced in another processes or a number of processes during processing. Therefore, without repeating process simulation many number of times for each of various processes, it is possible to easily decide which processes in the sequence of process must be changed in conditions based on a finally obtained device structure.

This first simulator in the semiconductor simulation apparatus of third feature can of course comprise a geometry obtaining unit which obtains the geometry and pattern transfer of insulator films on a semiconductor substrate and the groove (trench) formed in the substrate, etc. Moreover, a semiconductor simulation apparatus according to the third feature the present invention comprises a second simulator, which should preferably be constructed in such a ways that the results obtained by the first simulator, i.e. the data including distribution profiles of impurities and defects in semiconductor devices may be entered directly to the second simulator, which then provides device behavior such as current vs. voltage characteristics. The high-speed and high-accuracy first simulator enables it to obtain rapidly and accurately the electrical characteristics etc. of semiconductor devices as the results of semiconductor simulation as a whole.

A fourth feature of the present invention also pertains to a semiconductor simulation apparatus including a first simulator which calculates a sequence of processes related to the fabrication of semiconductor devices, the first simulator comprises a material profile obtaining unit which sets plural same materials introduced under different conditions as mutually different materials in a prescribed process. According to the fourth feature, even when a plurality of conditions are set for the same materials, the same materials are handled as mutually different materials corresponding to the different conditions respectively, so that process simulation has to be performed only once in contrast to the conventional approach whereby the similar process simulations have to be performed a number of times corresponding to the number of conditions for materials to be introduced. Suppose, for example that there are provided three conditions for ion implantation. The conventional approach has to perform process simulation three times for the different implantation conditions, whereas the approach according to the fourth feature of the present invention is enough to perform process simulation only once by setting the three conditions simultaneously in one calculation, thus reducing the number of calculation times in the process simulation by two as compared to the conventional approach.

This first simulator in the semiconductor simulation apparatus of fourth feature of the present invention can of course comprise a geometry obtaining unit which obtains the geometry of insulator films, metal films on a semiconductor substrate or the trench geometry formed in the substrate. Moreover, this semiconductor simulation apparatus according to the fourth feature comprises a second simulator, which should preferably be configured in such way that the results obtained by the first simulator, i.e. the data of the distribution profiles etc. of impurities and defects in semiconductor devices may entered directly to the second simulator, which then would obtain the device behavior such as current vs. voltage characteristics. The high-speed and high-accuracy first simulator enables it to obtain rapidly and accurately the electrical characteristics etc. of semiconductor devices as the results of semiconductor simulation.

A fifth feature of the present invention pertains to a memory medium, whose contents can be read out by a computer, which stores programs to perform semiconductor simulation handling a sequence of processes related to the fabrication of semiconductor devices. Namely, the fifth feature lies in the simulation programs stored in the memory medium, which include a simulation which sets plural same materials introduced in some process as mutually different materials. According to the fifth feature, even same materials are to be introduced in semiconductor devices, the materials are discriminated in handling, so that the final results of process simulation would give the characteristics of each material without being affected by another same material introduced in another process or a number of processes during the processing. Therefore, it is possible to easily decide which specific process among the sequence of processes should be changed in conditions based on a finally obtained device structure.

A sixth feature of the present invention also pertains to a memory medium, whose contents can be read out by a computer, which stores programs to perform semiconductor simulation handling a sequence of processes for the fabrication of semiconductor devices. The programs stored in the memory medium include the step of handling plural same materials introduced under different conditions in a prescribed process as mutually different materials. The program will cause the step to be executed by the computer. According to the sixth feature, even when a plurality of conditions were set for a same material, each material having different condition is handled as a different one, so that process simulation has to be performed only once, in contract to the conventional approach whereby the similar process simulation has to be performed a number of times corresponding to the number of different conditions for the materials to be introduced. Suppose, for example, that there are provided three mutually different conditions for a prescribed impurity to be introduced in semiconductor devices. Even in the case of a single process, the conventional approach has to perform process simulation three times corresponding to the different conditions, whereas the sixth feature of the present invention enables it to set three conditions simultaneously, to obtain desired results by performing process simulation only once, thus reducing the number of calculation times in performing simulation by two as compared to the conventional approach. This advantage is even more conspicuous when a large number of processes must be performed consecutively.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 4A is a block diagram showing a functional configuration of a first simulator of the semiconductor simulation apparatus related to an embodiment of the present invention;

FIG. 8 is a flowchart outlining a fabrication process for forming nMOS FETs;

DETAILED DESCRIPTION OF THE INVENTION

Figure 1:
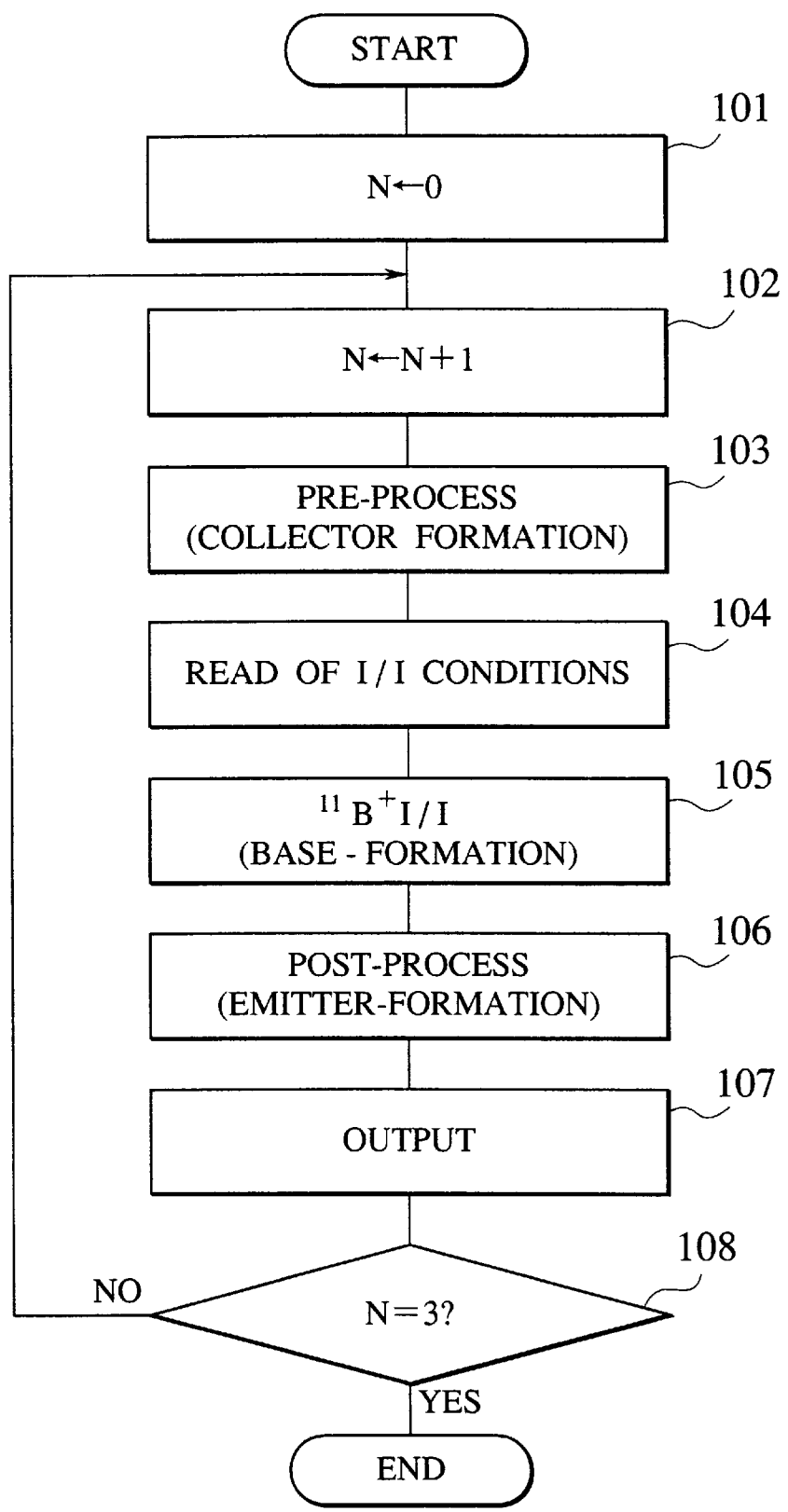
FIG. 1 is a flowchart showing a processing procedure for conventional process simulation in the case of implanting boron under three different conditions (N=1–3) to form p-type base regions in the process of fabricating npn bipolar transistors.
Figure 2:
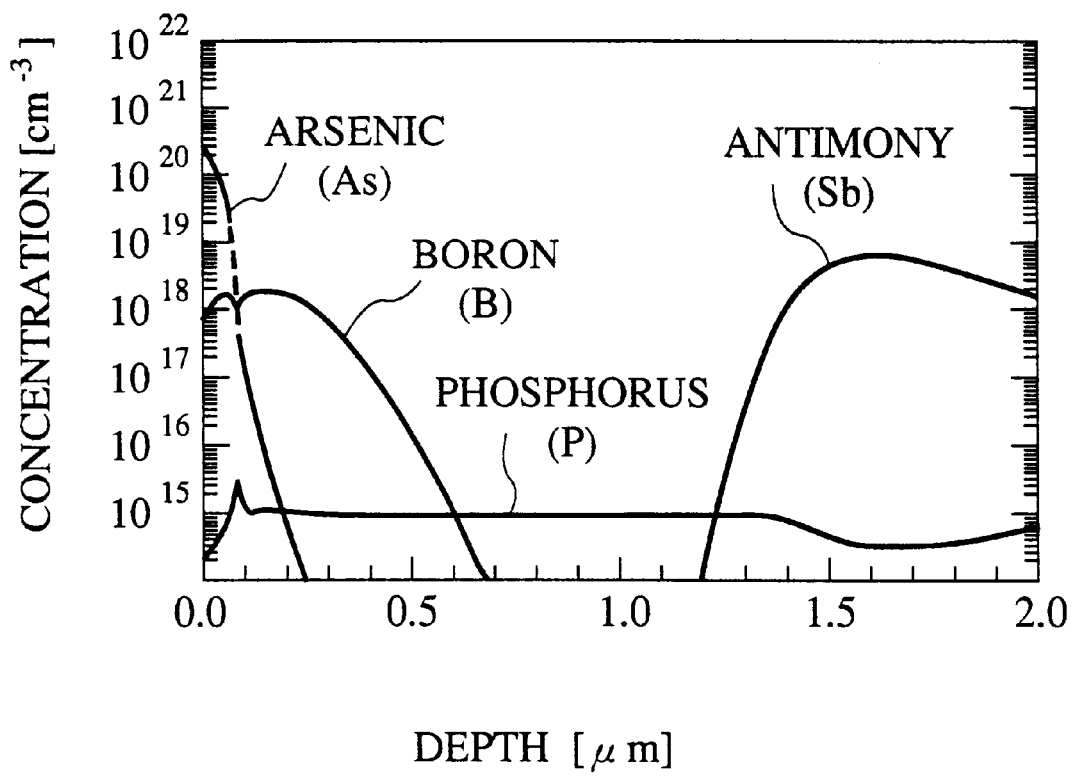
FIG. 2 is one-dimensional vertical distribution profiles of various kinds of impurities constructing npn bipolar transistors in the case where boron ($^{11}B^+$) ion acceleration energy is 50 keV (N=1), obtained by the processing procedure shown in FIG. 1.
Figure 3:
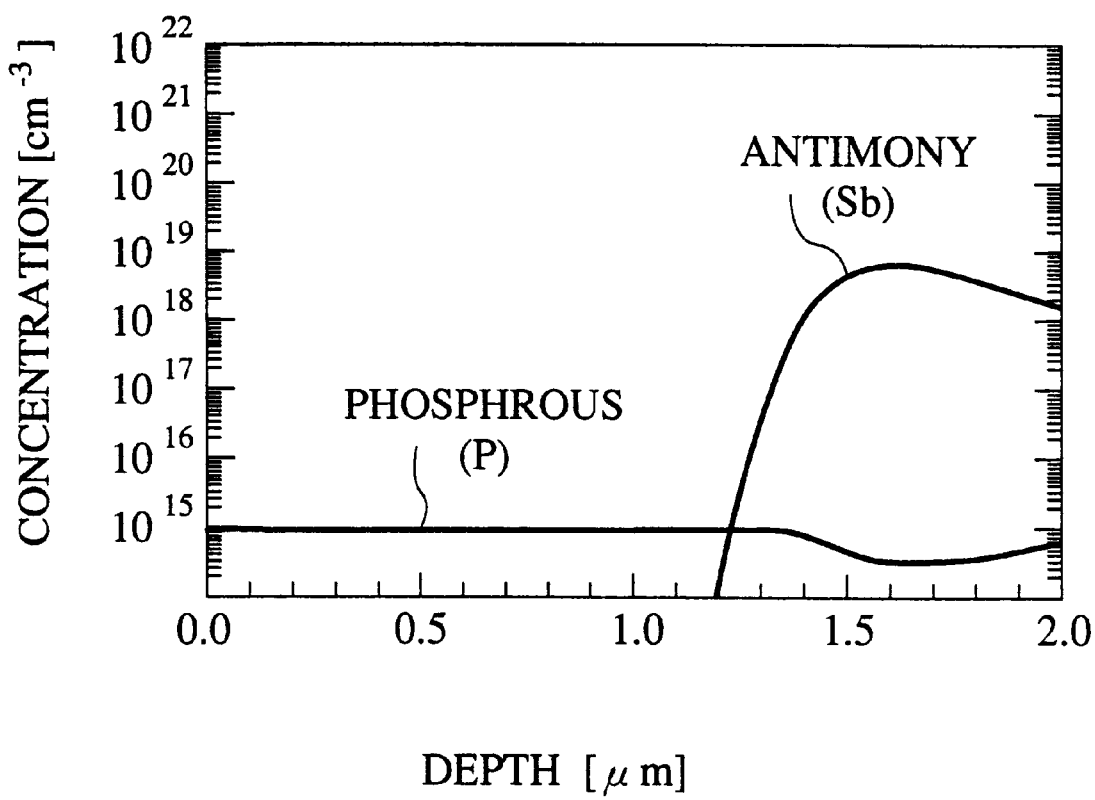
FIG. 3 shows one-dimensional vertical distribution profiles after antimony ($^{122}Sb^+$) and phosphorus ($^{31}P^+$) ions were implanted and annealed to form collector regions in the process of fabricating npn bipolar transistors, wherein base region-forming ions are going to be implanted under various conditions.

A preferred embodiment of the present invention will be described with reference to various example and the accompanying drawings. It is to be noted that the same or similar reference numerals applied to the same or similar parts and elements throughout the drawings, and the description of the same or similar parts and elements will be omitted or simplified.

FIG. 4A is a block diagram showing functional configuration of a process simulator (first simulator) in a semiconductor simulation apparatus related to an embodiment of the present invention. This process simulator has a function to simulate semiconductor device fabrication processes including deposition processes such as CVD, eitaxy, vacuum evaporation and sputtering, etching processes such as RIE, ion implantation process, oxidation process, and diffusion process as well as a function to output device geometry and distribution of impurities/defects in semiconductor devices onto a display. As shown in FIG. 4A, a first simulator (process simulator) 10 related to an embodiment of the present invention comprises: an input equipment 11 which receives inputs such as data and instructions from an operator; a processor 12 which has a function to simulate a sequence of processes; an output equipment 13 which outputs simulation results; a data memory 14 which stores prescribed data required for semiconductor device fabrication processes as an input; and a program memory 54 which stores simulation programs etc.

Here, the processor 12 for simulating a sequence of processes comprises an oxidation simulating unit 21, a deposition simulating unit 22, an etching simulating unit 23, an ion implantation simulating unit 24, a diffusion simulating unit 25, etc. The deposition simulating unit 22, for example, covers low-temperature CVD, high-temperature CVD, epitaxial growth, vacuum evaporation, sputtering, etc. Also, the etching simulating unit 23 will of course covers RIE, ECR ion etching, photo-excited etching and other dry etching processes, as well as wet etching, etc. The input equipment 11 comprises a keyboard, mouse, light-pen, floppy disk unit, etc. The processor 12, the data memory 14, and the program memory 54 comprise usual computer systems including a CPU and memory. For example, the program memory 54 or data memory 14 may include ROMs, RAMs, magnetic disks, optical disks, magneto-optical disks, and other memory devices connected to the CPU. The output equipment 13 comprises a display, printer, etc.

Input data for various processings executed by the above-mentioned processor 12 is stored in the data memory 14, while program instructions are stored in the program memory 54, so that those data pieces are read by the CPU to execute arithmetic operations and, at the same time, numeric information generated at various processes is stored in the RAMs, magnetic disks, or other memory devices.

The programs used to realize semiconductor simulation methods according to the present invention may be stored on recording media which can be read out by the computer. The contents of those recording media can be read out by the computer system and stored at the program memory 54, so that the programs can be executed by the processor 12 to realize the semiconductor simulation methods. Recording media, here, include computer's external memories, magnetic disk systems, optical disk systems, magneto-optical disk systems etc. which can store a lot of programs.

Figure 4B:
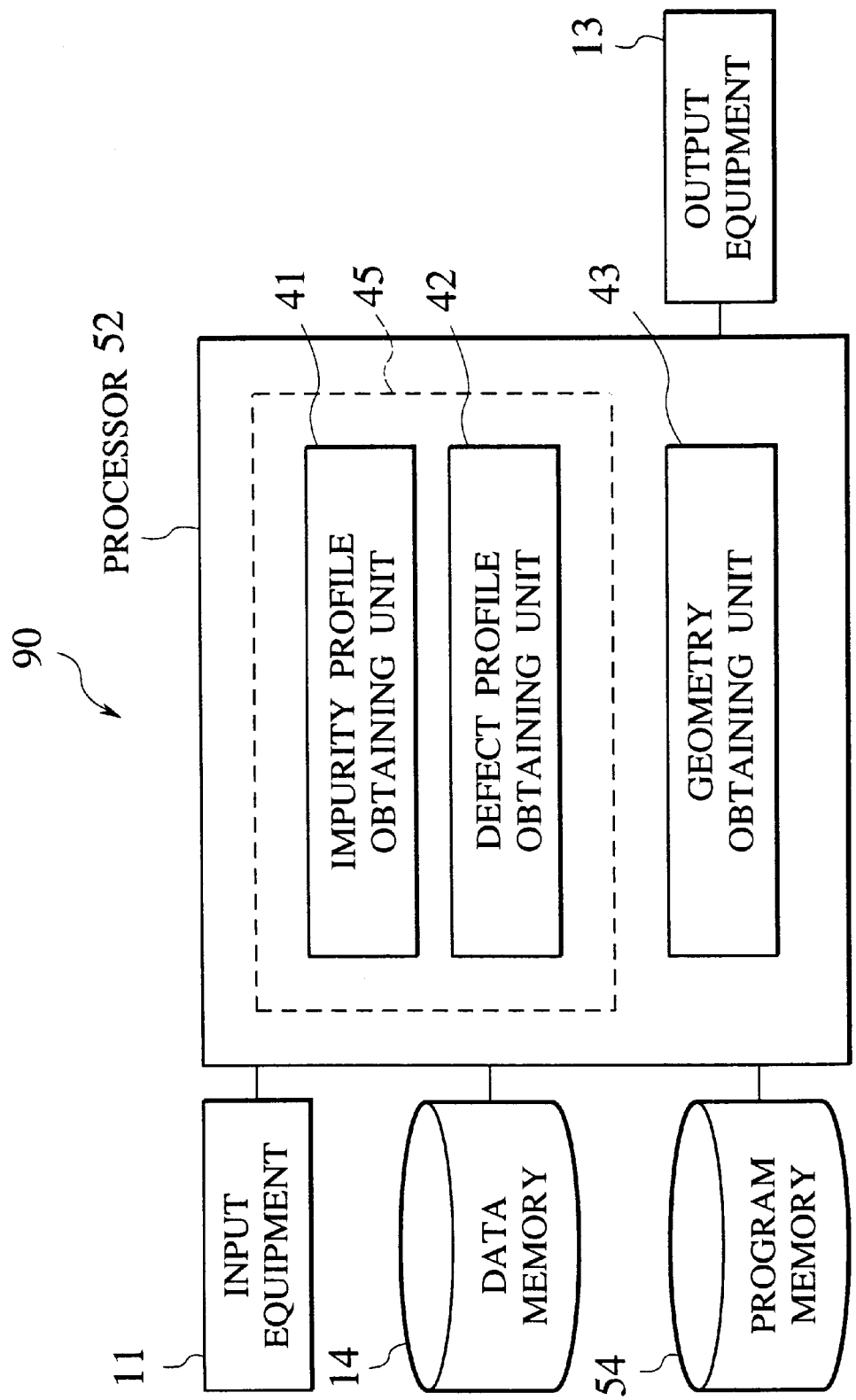
FIG. 4B is a block diagram showing another functional configuration of the first simulator related to the present invention.

FIG. 4B is a block diagram showing another functional configuration of a first simulator (process simulator) related to an embodiment of the present invention. A process simulator 90 shown in FIG. 4B comprises at least: an input equipment 11 which receives as an input the data and instructions from an operator; a processor 52 provided with a functional means to simulate a series of fabrication processes; an output equipment 13 which outputs simulation results; a data memory 14 which stores prescribed data required to simulate semiconductor device fabrication processes; and a program memory 54 which stores simulation programs of the fabrication processes of semiconductor device. The processor 52 comprises at least a material profile obtaining unit 45 and geometry obtaining unit 43. The material profile obtaining unit 45 includes an impurity profile obtaining unit 41 which obtains the impurity distribution profiles in semiconductors, polysilicon films, or insulator films and a defect profile obtaining unit 42 which obtains the distribution profiles of defects in semiconductors constructing the semiconductor device. The geometry obtaining unit 43 obtains the geometry and pattern transfer of insulator films, wiring layers on a semiconductor substrate or grooves and trenches formed in the semiconductor substrate. The material profile obtaining unit 45 will perform diffusion simulation to obtain the distribution profiles of materials in a semiconductor device. To this material profile obtaining unit 45 which obtains material distribution profiles are related the ion implantation simulating unit 24 and the diffusion simulating unit 25 within the processor 12 shown in FIG. 4A. The material profile obtaining unit 45 is also related the oxidation simulating unit 21 and the deposition simulating unit 22 because heat treatment is involved in the processing. The geometry obtaining unit 43 which performs geometry simulation to obtain the changes in geometry of oxidation film edges—the bird's-beak geometry—involved in LOCOS, the geometry of gate electrodes of polysilicon and refractory metal involved in CVD or other deposition processes, and the geometry of Al wiring layers, trenches in semiconductors, etc. Hence, the geometry obtaining unit 43 is related to the oxidation simulating unit 21, the deposition simulating unit 22, the etching simulating unit 23, etc. within the processor 12 shown in FIG. 4A. Also, the input equipment 11 comprises: a keyboard; a mouse; a light-pen; or a floppy disk unit. The processor 12, the data memory 14, and the program memory 54 are included in a usual computer system which comprises a CPU memories. The data memory 14 and the program memory 54 may be ROMs, RAMS, magnetic disks, optical disks, magneto-optical disks, magnetic tapes and other memories connected to the CPU. Also, the output equipment 13 comprises a display or a printer.

Input data for various processings executed by the processor 52 of the process simulator 90 shown in FIG. 4B is stored in the data memory 14, while program instructions are stored in the program memory 54. Those data items and program instructions are read by the CPU as required to execute arithmetic operations, during which numeric information and other data generated at various processes are stored in RAMs, magnetic disks, magnetic tapes, or other memory devices. Also, programs used to perform a semiconductor simulation method according to the present invention may be stored on recording media whose contents can be read out by the computer. Such recording media contents can also be read in by the computer system and stored in the program memory 54, so that the programs will be executed by the processor 12 to realize the semiconductor simulation method. Recording media referred to here include, for example, computer's external memories, semiconductor memory systems including RAMs and ROMs magnetic disk systems, optical disk systems, magneto-optical disk systems, magnetic tape systems, and other devices that can record programs etc.

Figure 4C:
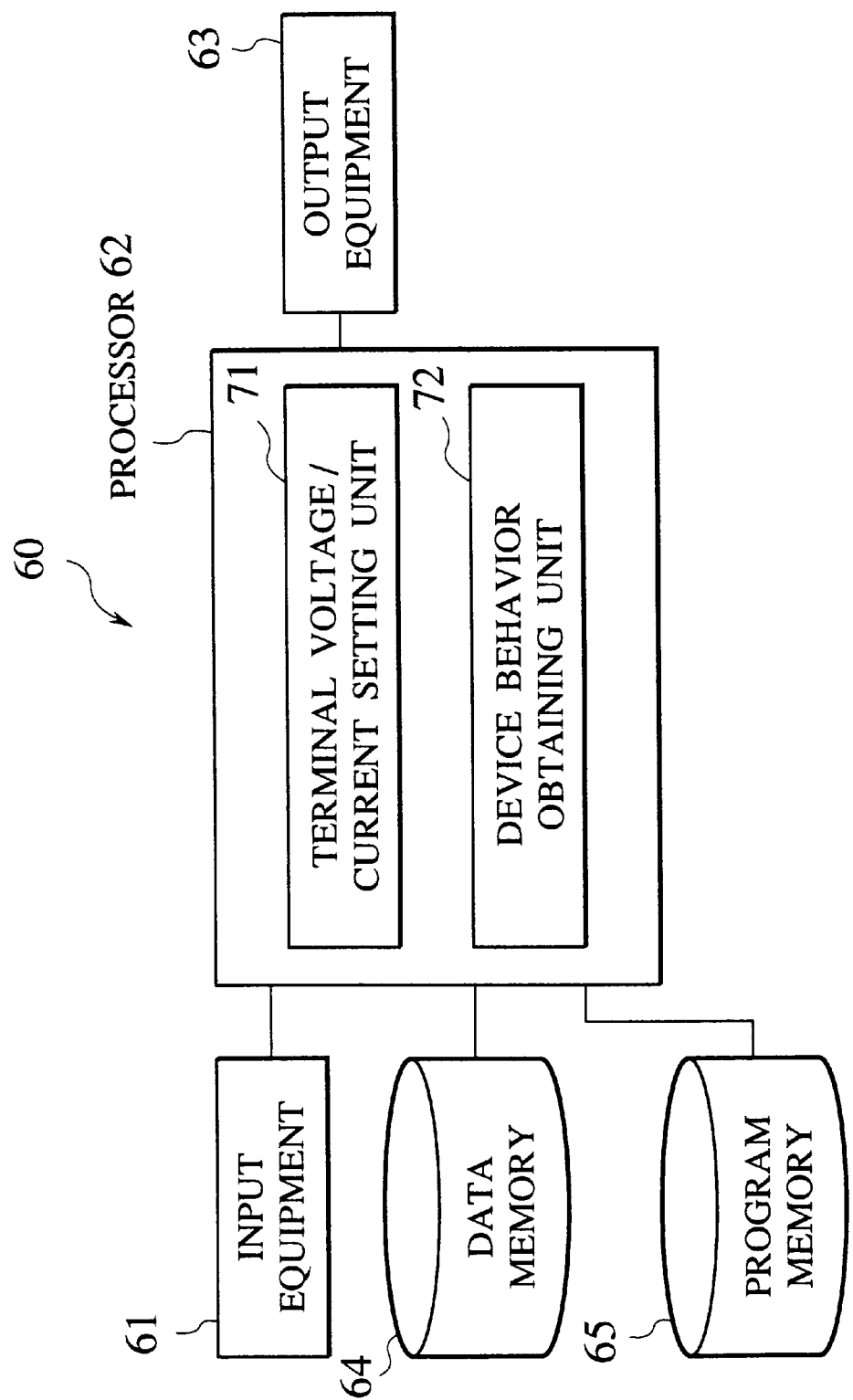
FIG. 4C is a block diagram showing a functional configuration of a second simulator in a semiconductor simulation apparatus related to an embodiment of the present invention.

As shown in FIG. 4C, a second simulator (device simulator) 60, on the other hand, inputs the results of device structures, impurity distribution profiles, etc. obtained by the first simulator (process simulator) and simulates electrical characteristics of devices by setting the application voltage, current, and other boundary conditions for thus input structures. The second simulator 60 displays on an output equipment thus obtained device behaviors, which may include potential profiles, electric field profiles, and current (carriers such as electrons and holes) profiles as well as current vs. voltage characteristics. As shown in FIG. 4C, the device simulator (second simulator) 60 related to an embodiment of the present invention comprises at least: an input equipment 61 which receives as an input those data and instructions from an operator; a processor 62 which simulates electrical characteristics of a semiconductor device; an output equipment 63 which outputs simulation results; a data memory 64 which stores prescribed data required to analyze the characteristics of semiconductor devices; and a program memory 65 which stores device simulation programs etc. The processor 62 comprises at least a terminal-voltage/current setting unit 71 and a device behavior obtaining unit 72. Also, the input equipment 61 comprises: a keyboard; a mouse; a light-pen; or a floppy disk unit. The processor 62, the data memory 64, and the data memory 64 are included in a usual computer system which comprises a CPU and ROMs, RAMs, magnetic disks, and other memory devices connected to the CPU.

The first simulator (process simulator) 10 and 90 related to the present invention shown in FIGS. 4A and 4B and the second simulator (device simulator) 60 related to the present invention shown in FIG. 4C as a whole construct the semiconductor simulation apparatus related to an embodiment of the present invention.

Figure 4D:
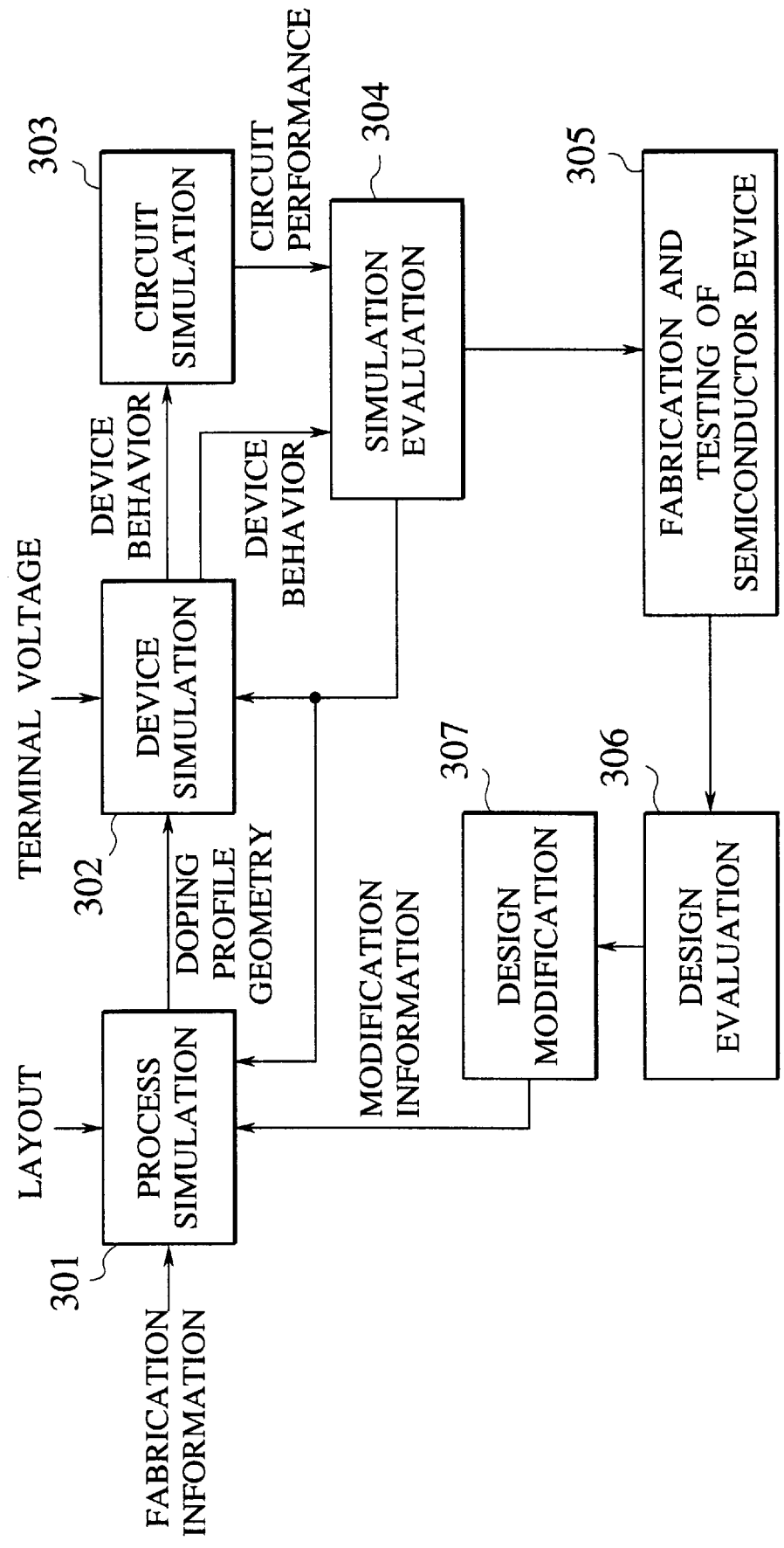
FIG. 4D is a flowchart showing a flow of fabricating semiconductor devices which employs process simulation and device simulation related to an embodiment of the present invention.

FIG. 4D is a flowchart showing a flow of fabricating LSIs or other semiconductor devices by use of the semiconductor simulation related to an embodiment of the present invention. As shown in FIG. 4D, the data including distribution profiles of impurities and defects in a semiconductor devices obtained by process simulation (step 301) including a first simulation (material profile simulation) and/or a second simulation (geometry simulation) of the present invention is directly input to a third simulation, i.e. device simulation (step 302), where the device behaviors such as current vs. voltage characteristics, impedance properties, high-frequency response, and other device characteristics are obtained. The high-speed and high-accuracy first simulation (material profile simulation) makes it possible to obtain electrical characteristics etc. of semiconductor devices rapidly and highly accurately. To carry out third simulation or the device simulation (step 302), necessary data of application voltage, current, and other electrical boundary conditions together with device structures and impurity distribution profiles obtained by process simulation (step 301) are supplied to the device simulator.

Also, device behavior obtained as a result of device simulation (step 302) may be given as input data to circuit simulation (step 303) as required, to obtain circuit performance. Device simulation (step 302) or circuit simulation (step 303) is used to check whether obtained characteristics match desired characteristics (step 304) and, if a match is detected, actual semiconductor-device fabrication processes start (step 305). If a match is not detected at step 304 to indicate that desired characteristics cannot be obtained by simulated fabrication processes, fabrication-process conditions are changed and process order or procedure is modified, to perform process simulation again (step 301). And, using the process simulation (step 301) results as input data the device simulation (step 302) is carried out again. The characteristics of an actual semiconductor device obtained by actual fabrication processes for semiconductor devices at step 305 are measured, to evaluate an original design (step 306). If this evaluation (step 306) tells that an actually fabricated semiconductor device's behavior does not satisfy demanded specifications, the design is changed, to perform process simulation again (step 301). The results of this processing simulation (step 301) are used as input data to perform device simulation (step 302), of which loop is repeated.

The semiconductor industries are actually competing each other to shorten a period of time as much as possible from the research (design) to development for LSIs and other semiconductor devices. The present invention greatly shortens a period of a loop ranging from process simulation (step 301), device simulation (step 302) shown in FIG. 4D, and other research (design) to development of semiconductor devices, thus providing huge industrial merits and importance.

Processing units (simulating units) shown in the processor 12 or 52 of FIG. 4A or 4B have usual simulation functions.

And various functions peculiar to the present invention are described by six examples as follows:

[EXAMPLE 1]

Example 1 relates to the first simulation (process simulation) that predict how the final impurity distribution profile of npn bipolar devices will be when the ion implantation condition to form p-type base regions of those bipolar devices is changed. This process simulation handles same boron ($^{11}B^+$) ions implanted with different acceleration energy as mutually different impurities in calculation, to perform numerical analysis by use of diffusion equations.

As impurities to form n-type collector regions related to example 1, antimony ($^{122}Sb^+$) is used at a deep high-concentration portion and phosphorus ($^{31}P^+$), at a portion near the substrate surface. After n-type collector regions are formed, same boron ($^{11}B^+$) ions with different conditions are implanted to form p-type base regions. Here, the energies to implant boron ($^{11}B^+$) ions are assumed to three different values of 50 keV, 60 keV, and 70 keV in process simulation to obtain conditions for optimal device characteristics, whose example is described below.

Figure 5:
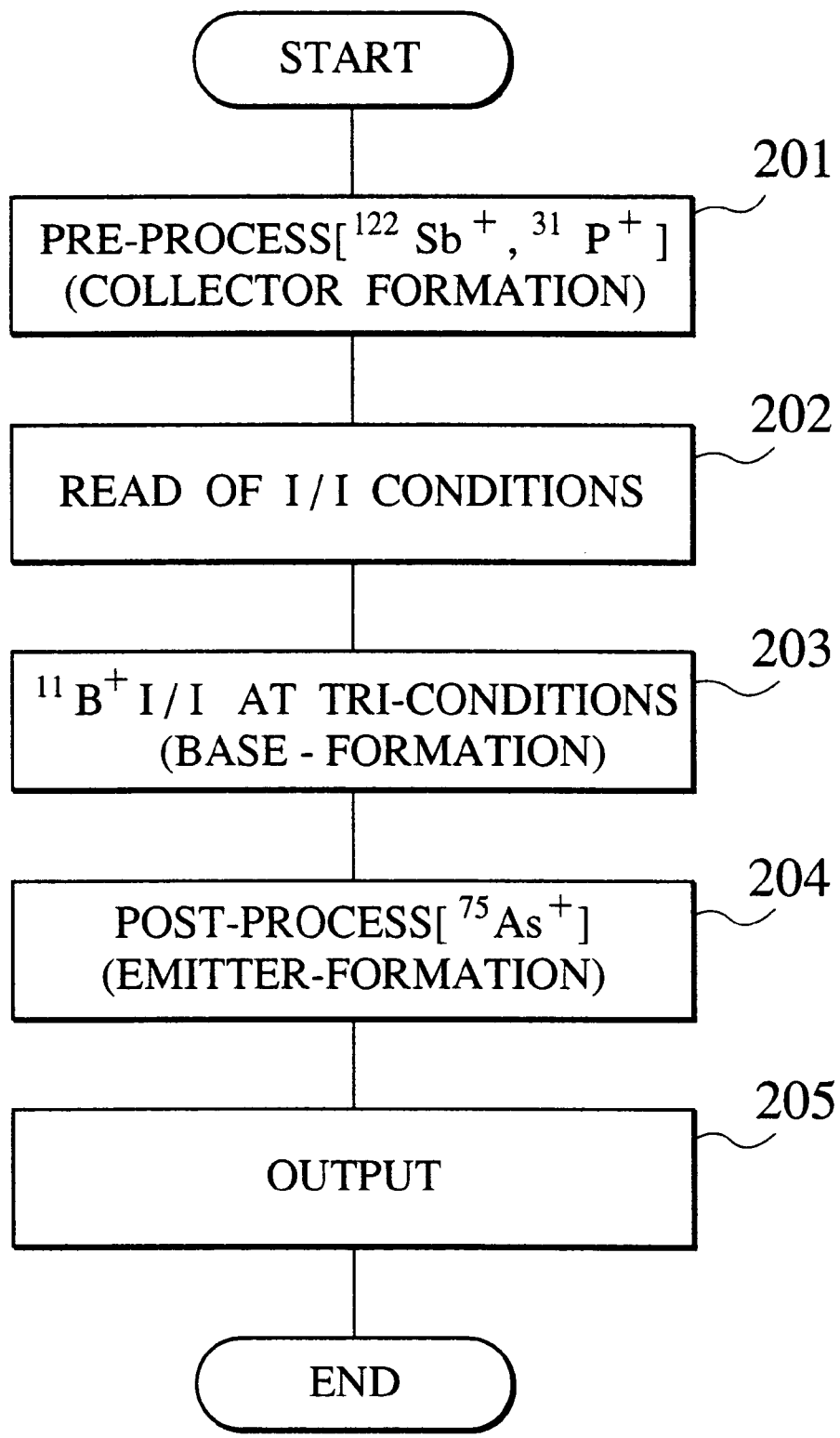
FIG. 5 is a flowchart showing a processing procedure of process simulation for npn bipolar transistors under different boron ($^{11}B^+$) ion-implantation conditions.

FIG. 5 is a flowchart showing a processing procedure of process simulation related to example 1, with reference to which is described the processing procedure.

(a) First, as pre-process, simulation is carried out on the formation of n-type collector regions by implantation of phosphorus ($^{31}P^+$) and antimony ($^{122}Sb^+$) ions. In this simulation, the ion implantation conditions for antimony ($^{122}Sb^+$) and phosphorus ($^{31}P^+$) to form n-type collector regions are read out firstly from, for example, the data memory 14 shown in FIG. 4B. Then, based on prescribed boundary conditions respectively of antimony ($^{122}Sb^+$) and phosphorus ($^{31}P^+$) such as ion implantation dosage Q, projected range Rp, its standard deviation ΔRp, etc., this simulation performs calculations on impurity diffusion taking into consideration of prescribed heat-treatment conditions such as substrate temperatures, annealing time, etc. (step 201).

Figure 6A:
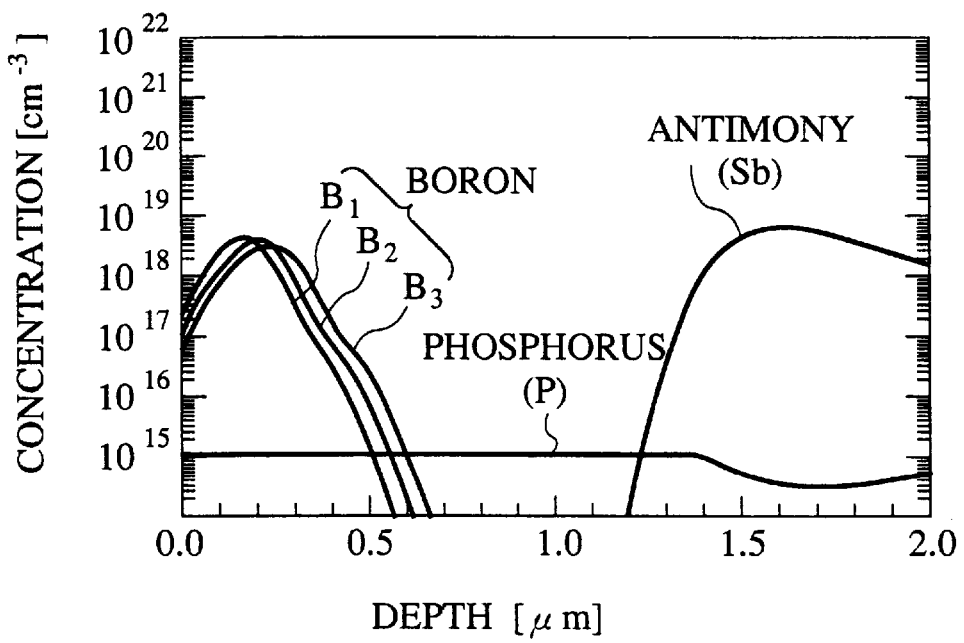
FIG. 6A is a vertical profile showing a one-dimensional impurity distribution immediately after three kinds of boron ($^{11}B^+$) ion-implantation conditions for npn bipolar transistor base regions are calculated simultaneously by the process simulation shown in the flowchart of FIG. 5.

(b) Next, this simulation reads out, from the data memory 14, all ion-implantation conditions for boron ($^{11}B^+$) to form p-type base regions (step 202). Here, it is assumed that three conditions for 50 keV, 60 keV, and 70 keV were read out. Then, on those three read out conditions of 50 keV, 60 keV, and 70 keV, ion-implantation simulation for boron is carried out as one of p-type base region formation processes (step 203). This simulation at step 203 takes simultaneously three conditions of 50 keV, 60 keV, and 70 keV as boron ion implantation conditions for base-region formation. In this case, as independent parameters for each mutually different elements B1, B2, and B3, this simulation employs their respective projected range Rp, its standard deviation ΔRp, and other prescribed boundary conditions, to perform calculations on impurity diffusion under the same base-region annealing conditions. Thus, this simulation obtains an impurity distribution profile such as shown in FIG. 6A. Since elements B1, B2, and B3 are originally the same boron itself, they will act inherently on a same physical principle for boron. However, in the simulation the calculation is treated as if there are three different boron on impurity diffusion involved in the subsequent heat treatment. Here, it is assumed that there are no interactions among elements B1, B2, and B3.

(c) As post-process, the simulation reads out, from the data memory 14, the arsenic ($^{75}As^+$) ion-implantation conditions for formation of n-type emitter regions. Based on thus read out ion-implantation conditions, the simulation performs calculations on the corresponding dosage Q, projected range Rp, and other prescribed boundary conditions for arsenic ($^{75}$As$^+$) as well as annealing conditions including post-implantation emitter activation, inter-layer insulator film/passivation film formation, metalization, and other impurity diffusion items involved in heat treatment (step 204).

Figure 6B:
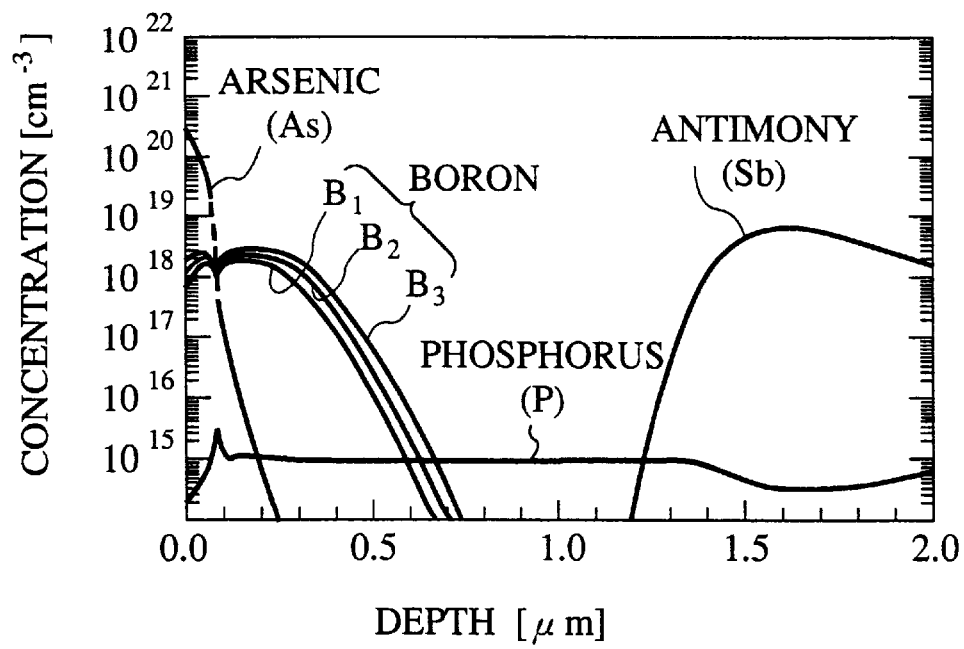
FIG. 6B is a vertical profile showing a final impurity distribution of npn bipolar transistors where an emitter-region impurity distribution is added to FIG. 6A.

(d) The simulation outputs final result such as shown in FIG. 6B (step 205). Simply speaking on the number of times of heat treatment of antimony ($^{122}$Sb$^+$) and phosphorus ($^{31}$P$^+$), it is necessary to carry out diffusion simulation three times: first heat treatment immediately after antimony ($^{122}$Sb$^+$) and phosphorus ($^{31}$P$^+$) ions are implanted; second heat treatment after boron ($^{11}$B$^+$) ions are implanted; and last heat treatment after arsenic ($^{75}$As$^+$) ions are implanted. Here, the simulation of example 1 counts as one each of heat treatment processes such as the anneal for emitter activation after arsenic ($^{75}$As$^+$) ion implantation, the inter-layer insulator film formation, the passivation film formation, the metalization, etc. For boron (B1, B2, B3) ion implantation, diffusion simulation must be carried out twice: first for heat treatment immediately after the implantation and second for post-treatment after arsenic ($^{75}$As$^+$) ions are implanted. And, for arsenic ($^{75}$As$^+$) ion implantation, diffusion simulation must be carried out once for the immediately subsequent heat treatment process. That is, in example 1 of a process simulation related to an embodiment of the present invention, time-consuming diffusion calculation is performed once for arsenic, twice for each of B1, B2, and B3, and trice for each of antimony and phosphorus, resulting in a total of 13 (1+2×3+2×3) times. The corresponding case of three boron implantation conditions to form similar npn bipolar device required 27 times of diffusion simulation as described in the flowchart of FIG. 1. That is, the present invention reduces the number of times of overall calculations by 14 as compared to the case of the flowchart of FIG. 1. Also, since calculation time required for diffusion simulation is roughly proportional to the total number of times of heat treatment weighted by the number of impurity elements employed, by employing a flowchart such as shown in FIG. 5, the process simulation time can be reduced roughly to 13/27, i.e. a half. Also, since the concentration of boron used to form p-type base regions is relatively low, no significant changes are given to device characteristics obtained even if effects on other impurities are ignored.

Although the above-mentioned flowchart of FIG. 5 is described on a case where the acceleration energy at time of a base-region formation process, in particular the condition of boron ion implantation, is changed, the flowchart can be applied of course to the case where the acceleration energy etc. are changed at time of ion implantation in other processes—emitter formation, or collector formation.

[EXAMPLE 2]

Example 2 related an embodiment of the present invention is described on simulation of implantation of boron ($^{11}$B$^+$) ions into channel regions to adjust the gate threshold voltage Vth of nMOS FETs. This simulation of Vth-control ion implantation handles in calculation the same plural borons introduced in another processes than that for Vth-control ion implantation as if mutually different impurities. Also, if there are provided a plurality of Vth-control ion implantation conditions, it is enough to calculate for one of Vth-control ion implantation condition. Because, another result for another implantation conditions will be obtained directly by multiplying the final result of one condition of the Vth-control ion implantation by a constant value.

Figure 7A:
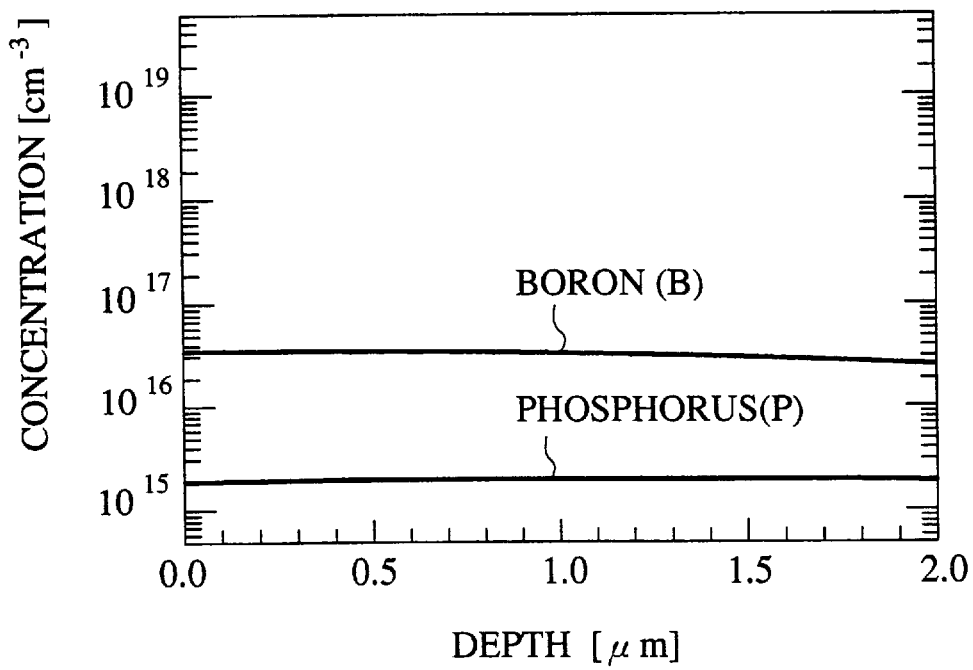
FIG. 7A is a one-dimensional impurity distribution of channel regions after p-type wells were formed in an n-type substrate in the nMOS FET fabrication process.
Figure 7B:
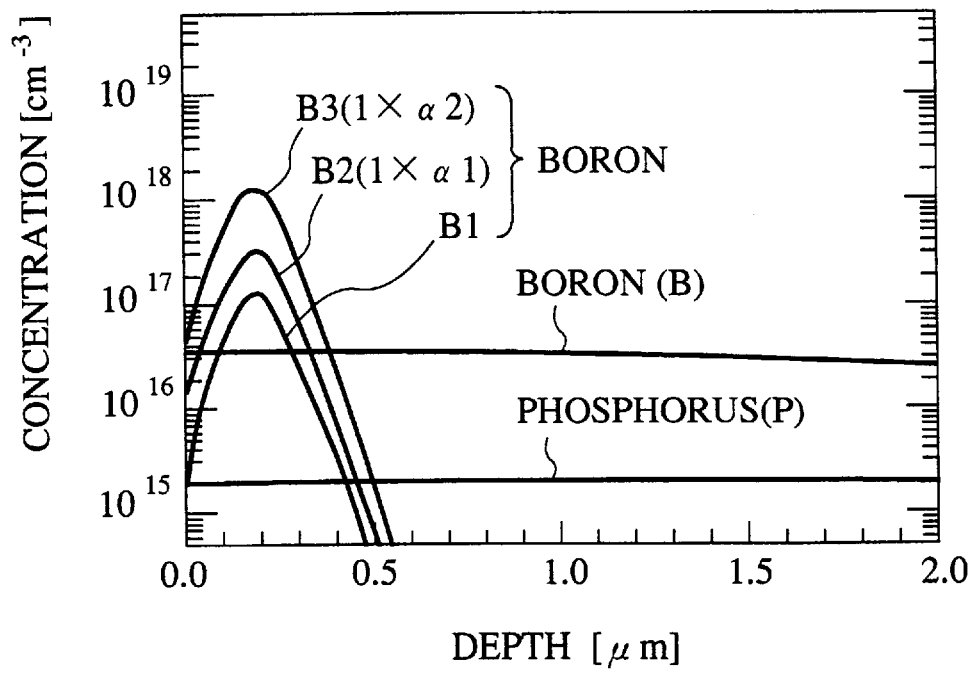
FIG. 7B is a one-dimensional impurity distribution of MOS FET's channel regions after simulation was continued to the extreme end following FIG. 7A.

FIG. 7A is a one-dimensional profile of an impurity in channel regions after a p-type well is formed using boron in an n-type substrate, whose horizontal axis indicating depth (micrometer) from the surface and vertical axis, concentration (cm$^{-3}$) respectively. After the p-type well is formed, for example, boron ions are implanted with an energy level of 50 keV and a dosage of 1×10$^{12}$/cm$^2$, to control the threshold voltage. In this case, by the conventional method, boron used to ion implantation is the same element B as that used to form the well, so that the subsequent processes do no discriminate them, resulting in for example addition of their respective values. A process simulation method in example 2 related to an embodiment of the present invention assumes boron used to control the threshold voltage to be B1 to handle it as being an element different from boron (B) in the well in calculation. Next, a gate oxide film is formed, to simulate the process of forming a gate electrode. Thus obtained final one-dimensional profile of an impurity in channel regions of nMOS FETs is shown in FIG. 7B.

Generally, the concentration of both boron B used to form p-type wells and boron B1 used to control the threshold voltage is low, so that interaction between B and B1 can be ignored. With this, when a dosage of B1 is multiplied by a constant value of α, the final profile for (α·B1) is obtained only by multiplying the simulated final distribution for B1 with the constant value of α. Therefore, in order to obtain an optimal structure by changing a dosage to control the threshold voltage, it is not necessary to simulate every fabrication processes but to multiply a finally obtained B1 concentration by a constant value α, to obtain desired results. FIG. 7B shows a case where B2 and B3 have been obtained by multiplying the result of B1 by α1 and α2 respectively.

If, here, the concentration of B and B1 is not larger than 1×10$^{18}$/cm$^3$, impurity distribution profiles B2 and B3 calculated by multiplication by a constant coincide largely accurately with impurity distribution profiles calculated strictly. If, also, the concentration is not larger than 1×10$^{19}$/cm$^3$, the concentration distribution profiles B2 and B3 have a coincidence enough to be used for rough estimates.

Although example 2 has been described on a case where the dosage of boron B1 to control the threshold voltage is changed, the condition for implanting ions of boron used to form wells may be changed.

It is assumed hereinafter that like example 2, example 3 through 6 related to embodiments of the present invention will handle same elements introduced in different processes as mutually different elements in calculation.

[EXAMPLE 3]

Example 3 related to an embodiment of the present invention is described on a case where based on a finally obtained impurity distribution profile of process simulation for fabricating nMOS FETs, a corresponding process where an impurity located at a specified position has been introduced can be known.

FIG. 8 outlines fabrication processes of forming p-type wells in an n-type substrate, to create an n-channel MOS FET therein.

The fabrication processes are simplified as follows:

(a) First, into an n-type silicon substrate to which phosphorus (P) is already doped, a $Si_3N_4$ film is deposited by CVD and then patterned so that only on device regions the $Si_3N_4$ film is selectively left. Using the $Si_3N_4$ film as an anti-oxidation film, oxidation (LOCOS) is carried out to form device-isolation insulator films with a thickness of 600 nm. Prior to device-isolation oxidation (LOCOS), channel-stop ions of p-type impurity boron (B1) are implanted at 100 KeV, with dosage of $1\times10^{13}/cm^{-2}$ into regions where the $Si_3N_4$ film was removed, thus preventing inversion of the surface of silicon substrate. In the device-insulation regions where the $Si_3N_4$ film was removed, a thick oxide film of 600 nm is formed, under which is introduced p-type impurity boron (B1) to prevent surface inversion. Then, the $Si_3N_4$ film used in LOCOS is removed.

(b) Into regions which act as active regions (or transistor regions), ions of boron (B2) are implanted at 100 KeV, with dosage of $1\times10^{13}/cm^{-2}$ to form a p-type well and then undergo drive-in diffusion to provide desired depth and concentration.

(c) A thin oxide film of 10 nm thickness which acts as a dummy oxide film is formed in the surfaces of the p-type well. Through the dummy oxide film are implanted ions of boron (B3) at 100 KeV, with dosage of $7\times10^{12}/cm^{-2}$ to control the threshold voltage Vth.

(d) Ions of boron (B4) to prevent punch-through are implanted at a higher acceleration energy of 80 KeV, with dosage of $5\times10^{12}/cm^{-2}$ so that high-concentration p-type regions are placed beneath the channel regions.

(e) The dummy oxide film is removed to form gate oxide films of 10 nm thickness. On those gate oxide films, a polysilicon film which acts as gate electrodes is deposited. The polysilicon film is cut by RIE to form the gate electrodes. Further, the patterned polysilicon surfaces are post-oxidized. Using thus patterned and oxidized polysilicon, ions of n-type impurity arsenic ($^{75}As^+$) are implanted at 30 KeV, with dosage of $5\times10^{15}/cm^{-2}$ into silicon regions which act as source or drain regions. At the same time, the arsenic ($^{75}As^+$) ions are implanted into the polysilicon region which acts as gate electrodes. Subsequently, the surfaces are covered with a CVD oxide ($SiO_2$) film and undergo heat treatment to activate the arsenic ($^{75}As^+$).

(f) Contact holes are opened in the CVD oxide film, so that into those created openings, Al or other metal is deposited by vacuum evaporation or sputtering. Then, this metal is patterned by RIE etc., to form a metal wiring pattern.

In example 3, when the above-mentioned fabrication processes are entered as input data, identification information (B1, B2, B3, B4) is added to each of elements to be introduced in prescribed processes which indicates specific processes in which the concerned element has been introduced. The identification information may come in a symbol, number, name, etc. which indicates the introduction process.

Figure 9:
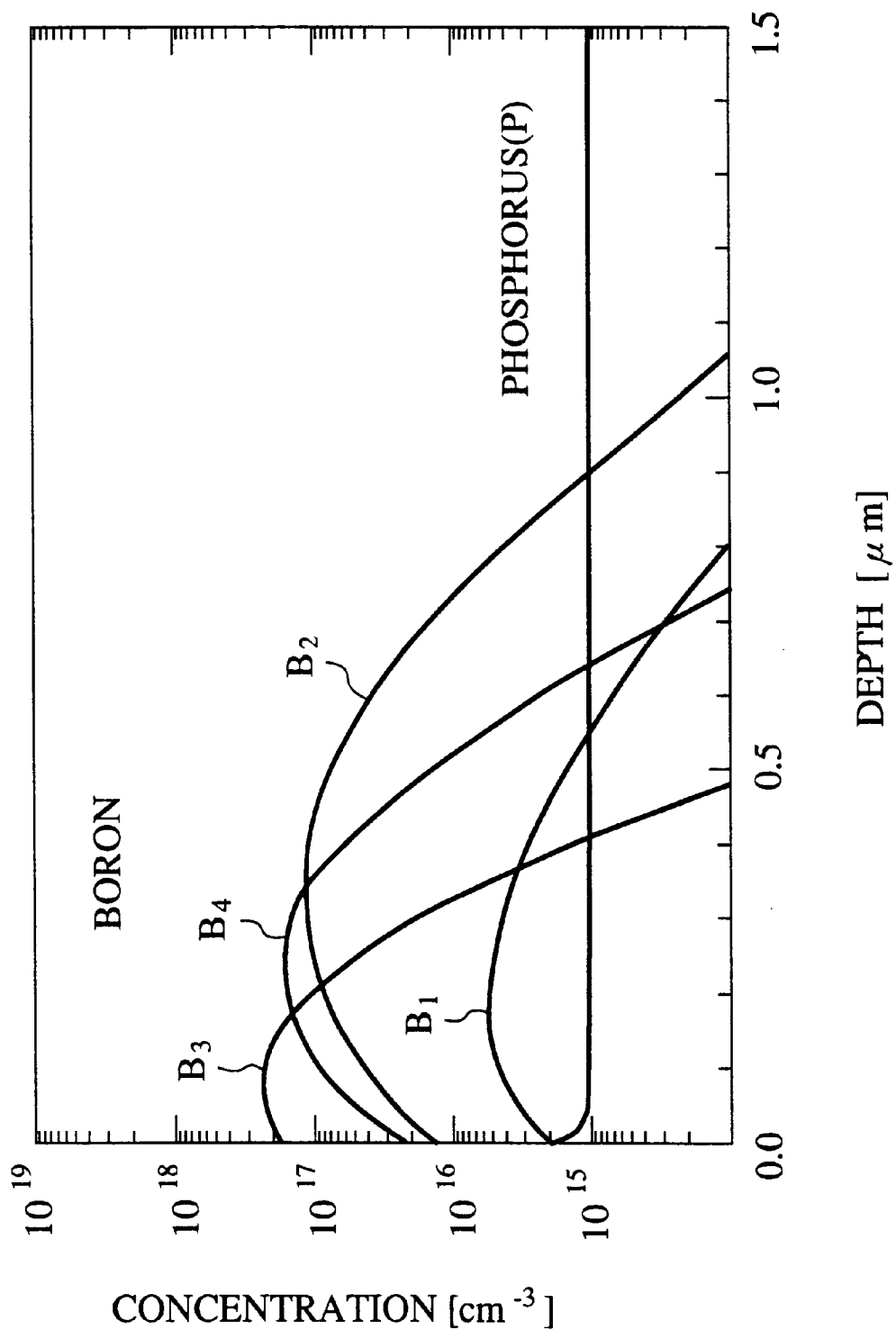
FIG. 9 is a one-dimensional impurity distribution of channel regions after all the processes for nMOS FET formation were completed according to the flowchart of FIG. 8.

A one-dimensional profile of impurities of finally obtained along a vertical direction in the channel regions after a sequence of process simulation steps have been performed is shown in FIG. 9. Out of those final results, ions of inversion-preventing boron (B1) are not directly implanted into channel regions but diffused laterally during the following heat treatment, so that the tail portions of laterally diffused regions invaded a portion of the channel regions as shown in FIG. 9. The conventional process simulation method does not discriminate any boron, so that four values are added and output into a one-boron graph. Therefore, it is impossible to know a specific ion-implantation process in which boron located at a specified position has been introduced on the basis of a finally obtained boron profile.

According to a process simulation related to example 3, plural same borons are handled as mutually different elements in different ion-implantation processes, so that a finally obtained impurity distribution profile can tell a proportion of specific boron at a given spatial position. If, for example, B4 is specified out of those elements, it is possible to easily know a specific process out of those of FIG. 8 by which the specified ions were implanted, based on identification information added to B4. More specifically, as a user interface to carry out process simulation for example, a computer display indicates calculated final profiles and numerals as well as input data shown in FIG. 8. By clicking a B4 profile out of overall profiles on the computer display, it is possible to easily know a specific process in which ions have been implanted because a B4-introduced process is indicated in a different color from the other processes or reverse-displayed together with the input data within a window.

Also, in this case, each element and identification information which indicates an introduction process are corresponded to each other in memory, so that any element introduced can be known by selecting the concerned process. For example, if a process in which B4 has been introduced is clicked on a mouse in a window indicating input data of FIG. 8 displayed on the computer display, the B4 profile is indicated in a different color from the other boron profiles or reverse-displayed, being very easy to identify.

If, therefore, finally obtained impurity concentration distribution profiles do not give desired electrical characteristics, it is easy to know a specific ion-implantation process in which impurity ions should be changed in terms of such conditions as dosage, acceleration energy, etc. Moreover, it is possible to trace how the distribution profile of B2 introduced during well formation finally changes through many heat treatment steps and also is effectively performed to change the conditions of desired heat treatment in order to optimize the concerned distribution.

Even when calculations were performed without inputting the data of a predetermined element to be introduced in steps during processing, process simulation results can be obtained for other elements than the concerned one. Thus obtained results cannot be used as usual process simulation results but are enough to know the impurity profiles themselves.

[EXAMPLE 4]

Example 4 related to an embodiment of the present invention describes a case where a device structure is not desirable partially. Namely, the example 4 pertains to a remedy for the case that the input data to device simulation of nMOS FET is found to be improper after calculating a sequence of fabrication steps by the process simulation. That is, example 4 explains about a case where the profiles of some elements are rewritten promptly and then used as input data to device simulation. More is considered where well-forming boron B3, threshold voltage-control boron B1, and punch-through protection boron B2 have been introduced into channel regions of an nMOS FET.

Figure 10:
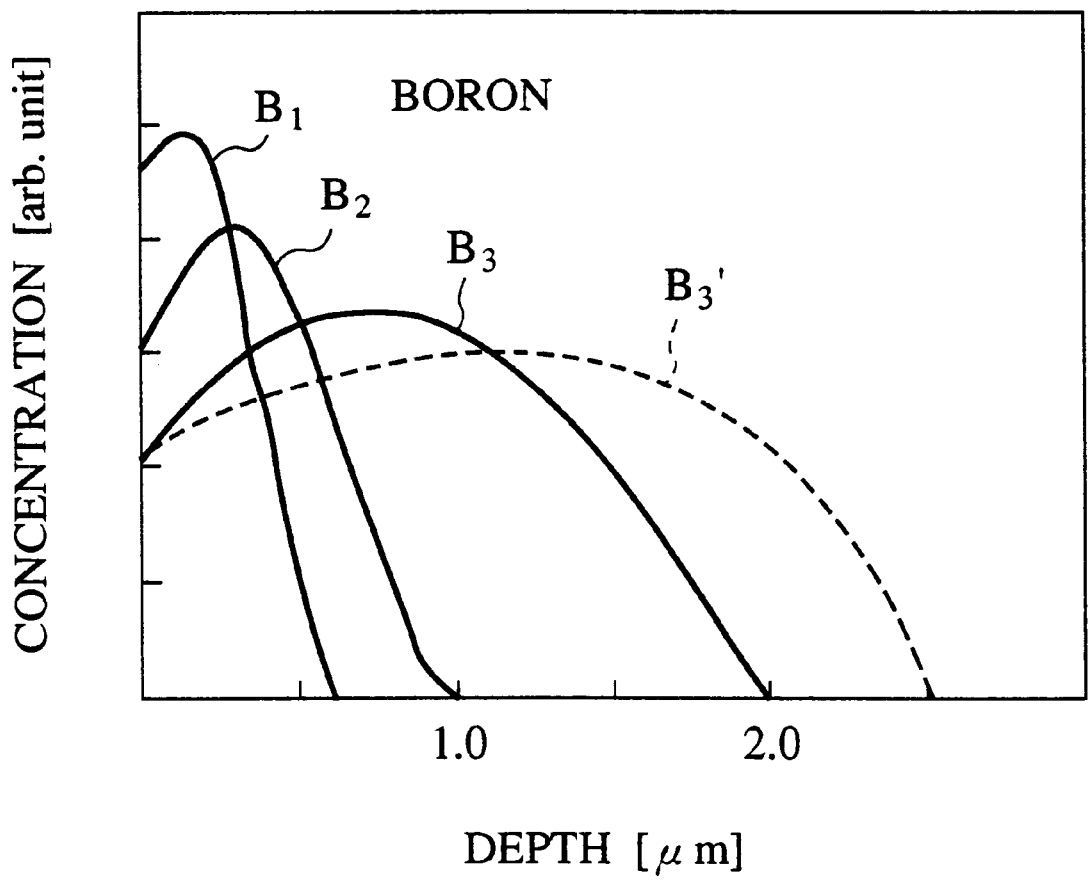
FIG. 10 is a one-dimensional impurity distribution of a case where part of an impurity distribution of nMOS FET's channel regions was rewritten.

FIG. 10 is a one-dimensional impurity profile in channel regions obtained by device simulation. To modify a concentration of a finally obtained channel's p-type impurity at a depth of about 1.0 micron from the substrate surface a little lower than the calculated result of process simulation, mostly without changing the concentration at the substrate surface after an impurity distribution profile of each boron element introduced is output, i.e. for example to rewrite the profile of well forming boron B3, it is necessary as shown in FIG. 10 to select a B3 profile and expand its vertical distribution profile to a desired value. In this case, the B3 profile is selected by a cursor from among those profiles shown in FIG. 10 and then the cursor is, for example, dragged to a desired value, to display a profile such as indicated by a broken line B3'.

Thus, when a result of impurity B3 out of spatial distribution profiles obtained by the process simulation does not match a desired profile, the spatial distribution profile of B3 can be rewritten by the above-mentioned method, to rapidly start the next job of device simulation without carrying out process simulation again with different conditions.

The above-mentioned rewriting of profiles can be expressed by an approximation equation specifically using a vertical distribution profile of B3 as the function of depth x. More specifically, an existing profile B3' is rewritten into such a new B3 distribution profile that the width of that distribution profile would expand as a function C(x). Then, the new distribution profile B3' is substituted for B3 obtained as a result of process simulation. To change a distribution profile, some restrictions may be imposed so as to keep a total amount of materials introduced at a certain level. Or, another restriction such that only a peak concentration is reduced may be employed to modify the distribution profile. Thus, it is possible to easily rewrite spatial distribution profiles of specific material by expressing impurity profiles as a function of position coordinates C(x).

Also, instead of rewriting into a format of distribution functions, a return may be made to the process simulation, to intentionally enlarge only a diffusion coefficient of B3 and then perform diffusion calculations again, so that by lowering the peak concentration of B3, a desired impurity profile may be created, to rapidly transfer to the next device simulation job.

[EXAMPLE 5]

Example 5 related to the present invention describes a case where in process simulation of nMOS FET, a specific mask pattern or mask opening used to introduce an impurity can be known and also an impurity profile can be moved parallel in a specified direction to provide promptly input data to device simulation.

Figure 11A:
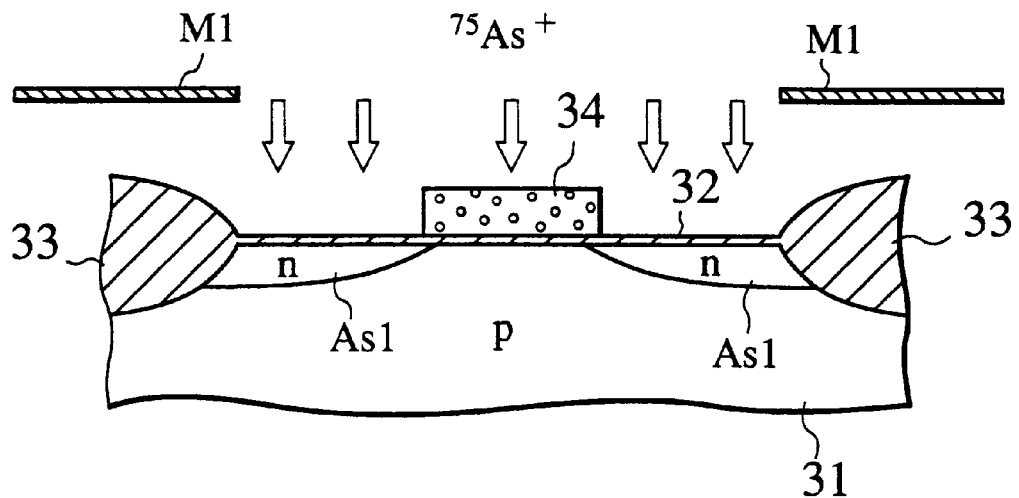
FIG. 11A is a profile where As1 ions are implanted using a mask pattern M1 when nMOS FET's source/drain regions are formed.
Figure 11B:
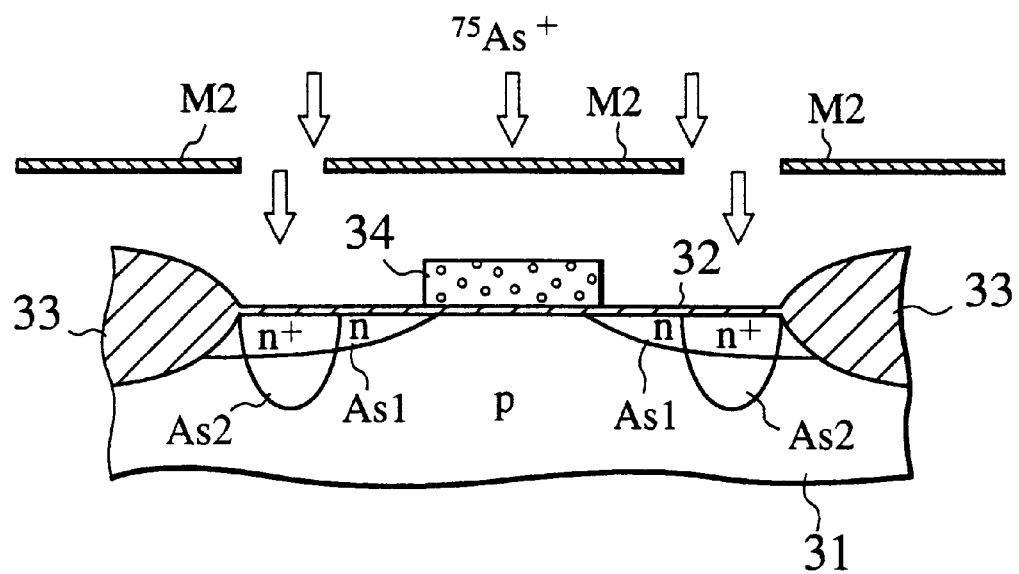
FIG. 11B is a profile where As2 ions are implanted using a mask pattern M2 following FIG. 11A.

A case is considered, as shown in FIG. 11A, where into a p-type silicon region 31 surrounded by a device-isolation oxide film 33, ions of arsenic ($^{75}As^+$) are implanted through a gate oxide film 32. The area to be implanted with arsenic ($^{75}As^+$) are self-aligned with a gate polysilicon 34 and arsenic ($^{75}As^+$) ions are implanted into the p-type silicon region 31, using two masks M1 and M2 to fabricate an nMOS FET in example 5. In this case, to discriminate between arsenic As1 introduced in nMOS FET's source and drain regions and As2 introduced into a substrate directly under contact holes to lower contact resistance, As1 is provided with identification information which indicates an opening in mask pattern M1, while As2 is provided with identification information which indicates an opening in mask pattern M2 of contact holes as shown in FIG. 11B. The identification information in this case may come in a symbol, number, or name which indicates, for example, a mask pattern or its opening introduced.

Figure 12A:
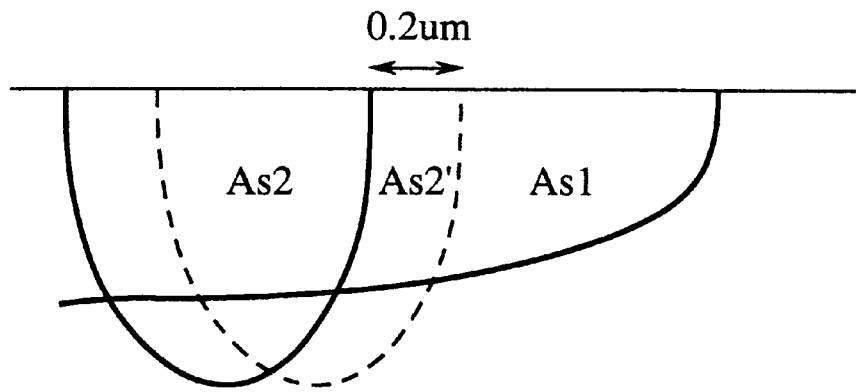
FIG. 12A is a schematic diagram for obtaining an impurity distribution where the relative position of a mask pattern is shifted.

When two masks M1 and M2 are used, a spatial distribution profile of impurity such as shown in FIG. 12A is obtained after all processes of simulation are terminated. According to a simulation method of example 5, the plural same arsenic elements are handled as different elements in a different introduction process, so that a finally obtained impurity distribution profile will tell a proportion of specific arsenic element at a given position. If, for example, As2 is specified, it is possible to easily know a specific mask pattern or mask opening used to introduce As2, based on identification information added to As2. Therefore, if a spatial distribution profile finally obtained as a result of process simulation does not give a desired profile, it is possible to identify which mask pattern or masks opening must be changed and the input data to device simulation is rapidly modified to the desired profile.

Suppose that a position of mask M2 of FIG. 11B is 0.02 micrometer away horizontally relative to mask M1 of FIG. 11A. In this case, the conventional method has to shift the value of the position of mask M2 by 0.02 micrometer and then carry out process simulation again. According to a process simulation of the present invention, however, as shown in FIG. 12A, it is possible to move the position of As2 distribution profile by 0.2 micrometer horizontally to give a final impurity distribution profile. The procedure shown in FIG. 12A gives the same effects as moving the mask and carries out a process simulation based upon the moved mask. Hence, desired results are easily and promptly obtained without repeating mask-shift calculations from the beginning.

Figure 12B:
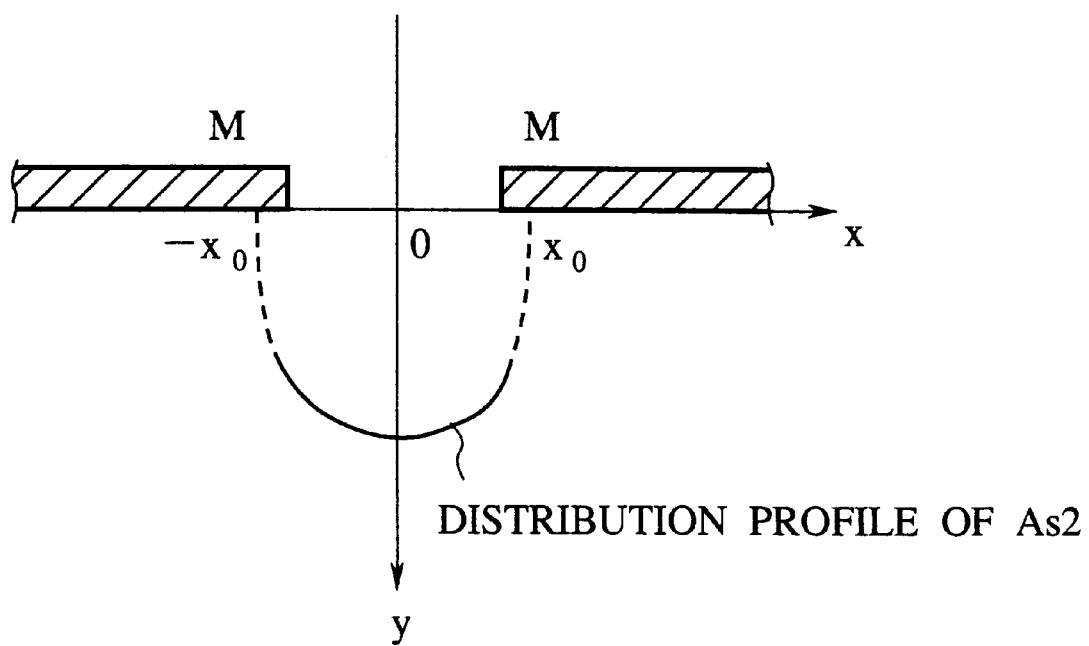
FIG. 12B is a schematic diagram illustrating the relationship between a mask pattern position and a position coordinates function C(x, y) for impurity distribution profiles.

As shown in FIG. 12B, where a horizontal direction is expressed as x direction and a depth direction is expressed as y direction, parallel movement of an impurity distribution profile shown in FIG. 12A can be realized by giving a numeral tantamount to +0.02 micrometer to the value of an x distance of each coordinates value forming the distribution profile. Also, an impurity distribution profile may be realized by expressing it in an approximation equation as a function of position coordinates. For example, an impurity distribution profile indicated by As2 in FIG. 12A can be approximated to a Gaussian distribution function that has its peak value at $y=y_o$ and horizontally to a complementary error function that the As concentration at edges of mask M2 opening is half the As concentration at the center of opening. That is, it can be expressed as a function of position coordinates for example as follows:

$$C_{As2}(x, y) = \frac{C_{max}}{2} \exp\left\{-\frac{(y-y_o)^2}{A}\right\}\left[erfc\left\{\frac{(x-x_o)}{\sqrt{2B}}\right\} - erfc\left\{\frac{(x+x_o)}{\sqrt{2B}}\right\}\right] \quad (1)$$

where erfc(x) is a complementary error function, Cmax is a peak concentration of a Gaussian distribution in a case where a y-directional profile is approximated to a Gaussian distribution, with the x-directional center of mask openings x=0. And $y_o$ is the peak position in the y direction, $2x_o$ is a width of a mask opening, and A and B are fitting parameters. FIG. 12A shows a case where a spatial distribution profile is moved parallel horizontally, but it can be moved parallel also vertically, obliquely, or in any other directions.

Figure 13A:
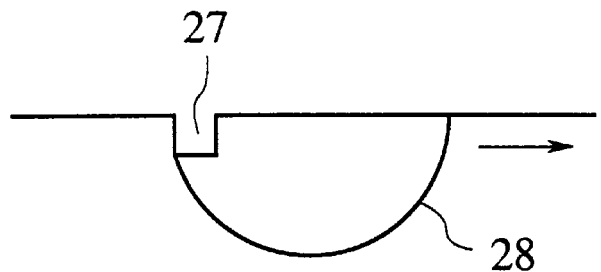
FIG. 13A shows a situation before a spatial distribution is parallel moved horizontally.
Figure 13B:
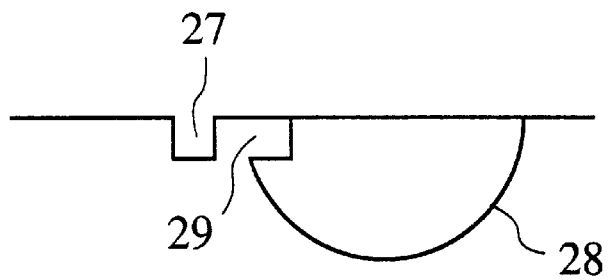
FIG. 13B shows a situation after the movement of FIG. 13A.
Figure 14A:
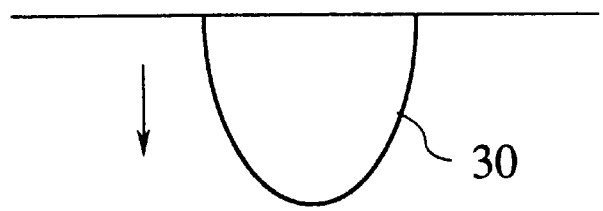
FIG. 14A shows a situation before a spatial distribution is parallel moved vertically.
Figure 14B:
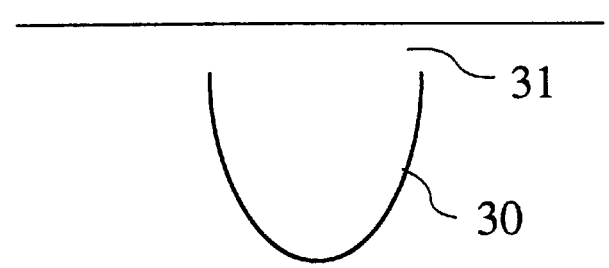
FIG. 14B shows a situation after the movement of FIG. 14A.

If a spatial distribution profile indicated on a computer display is moved parallel, notches or voids may occur where no materials (impurities or defects) existed before parallel movement. FIGS. 13A and 13B show one of such case to generate a notch. The notch is generated in the case that a concave region 27 and the profile of a specific material (specific impurity) overlap with each other as shown in FIG. 13A. In FIG. 13A, if the profile 28 is moved parallel horizontally, part of the profile 28 may have a notch 29 as shown in FIG. 13B. Also, as shown in FIG. 14A, if a profile 30 is moved parallel vertically, a void 31 will occur between a profile 30 and coordinates axis.

Figure 13C:
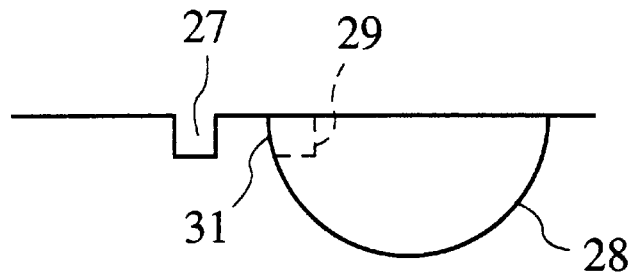
FIG. 13C shows a situation where part of the spatial distribution parallel shifted horizontally is extrapolated/interpolated.
Figure 14C:
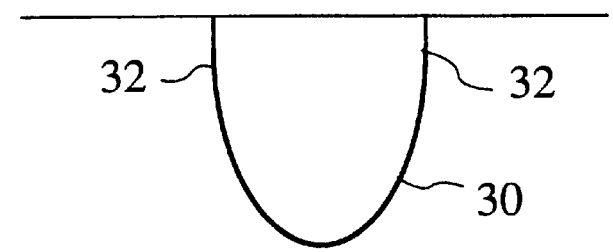
FIG. 14C shows a situation where part of the spatial distribution is parallel moved vertically.

By extrapolating or interpolating portions where no materials existed before parallel movement, notches and voids can be modified. As shown in FIG. 13C, for example, a notch 29 which occurs when the profile 28 is moved parallel horizontally is eliminated and, at the same time, to a void which occurs between the profile and a tangent line, a curve 31 is written. Also, as shown in FIG. 14C, a curve 32 is written to a void which occurs when the profile 29 is moved parallel vertically. Thus, by extrapolating or interpolating portions where no materials existed before parallel movement, it is possible to modify spatial distribution profiles of those portions into natural shapes without rewriting those profiles by re-calculation.

The above-mentioned movement and extrapolation/interpolation of spatial distribution profiles can be realized by specifically expressing a vertical distribution profile of As2 as a function of depth C(y), which is then used to edit the profiles. Also, instead of rewriting into distribution functions, spatial distribution profiles may be moved, extrapolated, or interpolated by other methods such as image processing.

[EXAMPLE 6]

Example 6 related to an embodiment of the present invention describes a case where in process simulation of LDD-pMOS FETs, such values as activation rate and diffusion coefficient are set independently to each other for the conditions of introducing boron ($^{11}B^+$).

In the case of a lateral LDD-pMOS FET formed in a n-type substrate or n-well, there are boron introduced into channel regions to control the threshold voltage Vth and boron to form source and drain diffusion layers and also boron in LDD regions to relax electric fields at the drain edges.

Figure 15A:
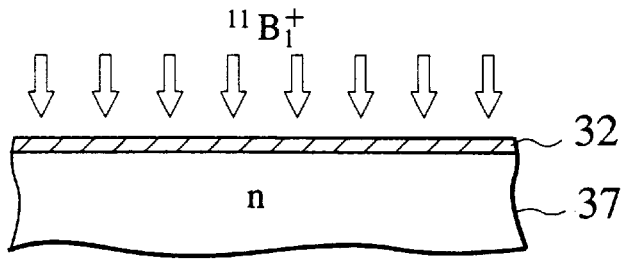
FIGS. 15A through 15E are cross-sectional views schematically showing a process of fabricating LDD-pMOS FETs.
Figure 15B:
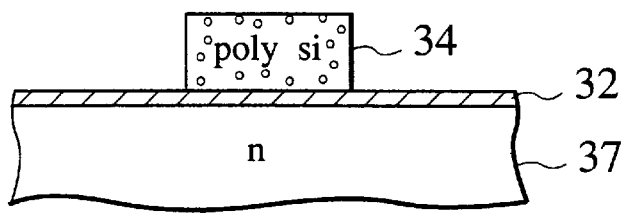
Figure 15C:
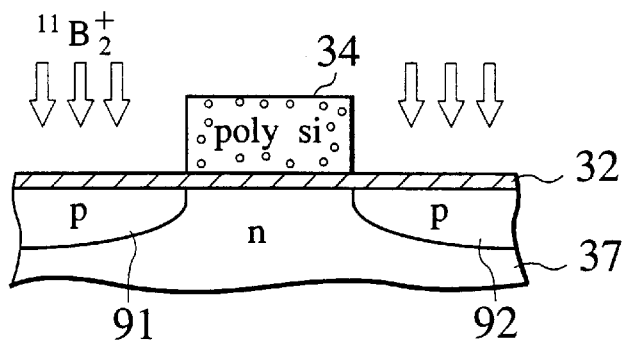
Figure 15D:
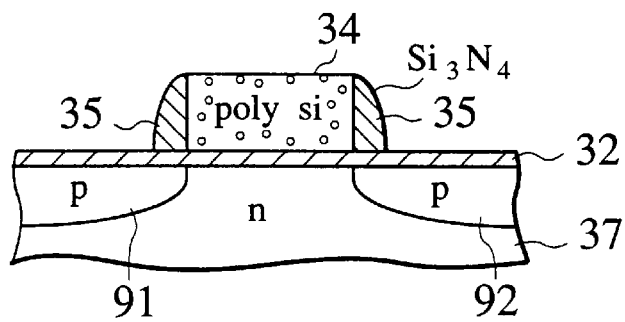
Figure 15E:
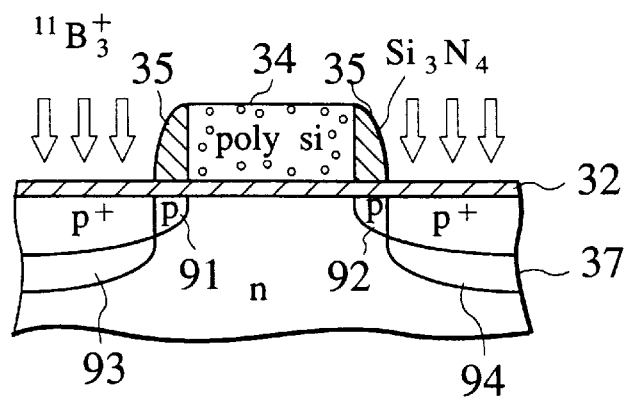

FIGS. 15A through 15E are schematic cross sectional views showing time-series processes of fabricating LDD-pMOS FETs. Concrete simulation comprises the steps of:

(a) introducing, as shown in FIG. 15A, Vth control boron (B1) is implanted through a gate oxide film 32 into an n-type semiconductor region (n-well);

(b) depositing polysilicon throughout the surface by CVD, to form a polysilicon gate electrode 34 as shown in FIG. 15B;

(c) implanting ions of boron (B2) in a self-alignment manner using the polysilicon gate electrode 34 as a mask, to form LDD regions 91 and 92 as shown in FIG. 15C;

(d) forming a side wall 35 using $Si_3N_4$ or oxide ($SiO_2$) films as shown in FIG. 15D; and (e) introducing, by implantation, the ions of boron (B3) into source and drain regions 93 and 94, as shown in FIG. 15E, using the polysilicon gate electrode 34 and the side wall 35 as masks, to activate them through heat treatment.

The conventional process simulation method handles all of introduced Vth control boron (B1), boron (B2) for LDD regions 91 and 92, and boron (B3) for source and drain regions 93 and 94 as same element in the following processes and calculates them assuming that they behave on the same physical principles. When actual device behavior is observed, however, there are some cases where better results can be obtained by assuming that diffusion coefficient and activation rate change with regions. Actually, diffusion coefficient and activation rate do not depend only on physical constants peculiar to a specific impurity atom but on a medium where the impurity atom exists, i.e. on a manner in which boron exists in the n-type silicon substrate 37 in the concerned example. Interaction between the medium and impurity atoms or existence manner of the impurity atom in the medium is not always made clear. Even some known knowledge about these are not necessarily employed within a realistic lapse of calculation time in detailed handling. Hence, the conventional process simulation employs as the diffusion coefficient and activation rate of boron in the n-type silicon substrate 37 the standard parameters for boron, which are fixed values.

In contract, a process simulation method related to example 6 can set different material constants and different parameters such as the activation rate and diffusion coefficient, independently for above-mentioned three borons (B1, B2, B3). For example, it is possible to contemplate, by process simulation of the present invention, such an extraordinary phenomenon occurring in actual devices that a final resistance of the LDD regions 91 and 92 becomes higher as compared to the concentration of the existing boron (B2). In this case, if we change the activation rate of only boron (B2) existent in the LDD regions 91 and 92 without changing the activation rate of the other channels and the source and drain regions, the result of process simulation can fit to actual devices.

Example 6 pertains to a case of setting different model parameters to same materials in process simulation. In calculating electrical characteristics by device simulation, after a structure is calculated, however, simulation results closer to realities can be easily obtained by, for example, setting different mobility to boron in the LDD regions 91 and 92 or by setting different upper limit of concentration to obtain activation rate to boron in the source and drain regions. Also, by utilizing this feature, various phenomena such as parasitic resistance occurring in actual devices which cannot be made clear can be identified or guessed in simulation.

Also, a process simulation method related to example 6 can set model equations which control the behavior of an introduced element independently of each other even if the element is the same. For example, as a cluster model to determine activation which is a problem in formation of high-concentration diffusion layers, the following two model equations are known.

(1) Charged cluster model

Generally, there is a model that impurity atoms, when existent at a high concentration in a silicon substrate, form a cluster (i.e., the atoms gather) as undergoing a heat process, deteriorating in activation concentration. In the case of arsenic (As), for example, there is a charged cluster model where three As atoms form one charged cluster as follows:

$$3As^+ + e^- \rightarrow As_3^{2+} \qquad (2)$$

In this case, the relationship between the total concentration C of As and activation concentration N is as follows with the equilibrium constant for cluster reaction assumed to be K:

$$C = (N + K \cdot N^{m+})/\{1 - (m-1) \cdot K \cdot N^m\} (m=3) \qquad (3)$$

(2) Neutral cluster model

In this cluster model, one vacancy V and two As atoms form one cluster as follows:

$$2As + V \rightarrow VAs_2 \qquad (4)$$

In this case, the relationship between C and N is as follows:

$$C = N + (K \cdot N)^m \ (m=4) \qquad (5)$$

Thus, the problem can be approximated.

Generally, conventional process simulation employs either of the above-mentioned two cluster models in calculation. Process simulation of example 6, actually, can set in such a way that As ions implanted in one process follows a charged cluster model, while As ions introduced in another process follows a neutral cluster mode. Thus, by setting model equations controlling the behavior of elements for each of processes independently of each other, it is possible to carry out more accurate process simulation.

Various modifications will become possible for those skilled in the art after receiving the teachings of the present disclosure without departing from the scope thereof. Although the above-mentioned examples 1 through 6 have described cases where boron and other impurities are handled as different elements, subject materials may be point defects which occur during ion implantation. A point defect refers to a partial destruction of the device structure of silicon substrate, i.e. a defect which occurs when an impurity is implanted into a silicon substrate or when a silicon substrate surface is oxidized or nitrided. As materials handled as different ones are of course available usual elements other than the above-mentioned impurity atoms and point defects which occurred during processing.

Programs used to realize the above-mentioned semiconductor simulation methods can be stored on recording media that can be read out by a computer system. The recording media can be read out by the computer system and then executed, to realize the above-mentioned semiconductor simulation methods as controlling the computer. The recording media here comprise for example semiconductor memory systems including RAMs and ROMs, magnetic disk systems, optical disk systems, magneto-optical disk systems, magnetic tape systems and other units which can record programs.

What is claimed is:

1. A semiconductor simulation method including a first simulation of obtaining spatial distribution profiles of materials in a semiconductor device, the first simulation comprising the steps of:

(a) setting a plurality of materials disposed in a same region in the semiconductor device so that, even when a same material is introduced in a certain process to the same region as material introduced in another process, the material introduced in the certain process is handled as being different from the material introduced in said another process in the same region; and (b) handling said plurality of materials mutually independently in the same region, to obtain spatial distribution profiles of said materials in said semiconductor device.

2. The semiconductor simulation method of claim 1, further including a second simulation of obtaining a geometry of the semiconductor device.

3. The semiconductor simulation method of claim 1, further including a device simulation of obtaining a device behavior of the semiconductor device employing a result of the first simulation.

4. The semiconductor simulation method of claim 1, wherein said material is an impurity atom or a point defect which occurred in semiconductor materials constituting said semiconductor device.

5. A semiconductor simulation method including a first simulation of obtaining distribution profiles of materials in a semiconductor device, the first simulation comprising the steps of:

(a) setting same materials introduced to a same region in said semiconductor device under different conditions in a prescribed process among a sequence of processes as mutually different materials in the same region at said prescribed process; and (b) handling said same materials mutually independently in the same region, to obtain spatial distribution profiles of said same materials in said semiconductor device.

6. The semiconductor simulation method of claim 5, further including a second simulation of obtaining a geometry of the semiconductor device.

7. The semiconductor simulation method of claim 5, further including a device simulation of obtaining a device behavior of the semiconductor device employing a result of the first simulation.

8. The semiconductor simulation method of claim 1, wherein a first sequence of processes pertaining to one condition of said material is simulated, and a result for second sequence with another condition of said material is obtained by multiplying a spatial distribution profile of said material obtained with said first sequence by a constant value.

9. The semiconductor simulation method of claim 1, wherein identification information is added to said material to indicate at which process said material was introduced so that after spatial distribution profiles of all materials introduced are output, a process at which a specified material was introduced can be known on the basis of said identification information.

10. The semiconductor simulation method of claim 1, wherein after spatial distribution profiles of all materials introduced are output, only a spatial distribution profile of a specified specific material is rewritten.

11. The semiconductor simulation method of claim 1, wherein identification information is added to said material to indicate a type of a mask pattern or a type of a pattern opening in a mask pattern for introducing said material in a semiconductor device so that after spatial distribution profiles of all materials were output, the mask pattern or the pattern opening can be known on the basis of said identification information.

12. The semiconductor simulation method of claim 1, wherein after spatial distribution profiles of all materials introduced in semiconductor device were output, a position of a specified material in a semiconductor device is moved in a specified direction.

13. The semiconductor simulation method of claim 12, wherein when the position of said specified material was moved, a portion where said material did not exist before the parallel movement is extrapolated or interpolated.

14. The semiconductor simulation method of claim 10, wherein after spatial distribution profiles of all materials introduced in a semiconductor device were output, a spatial distribution profile of a specified material in a semiconductor device is expressed as a function of a position coordinates, so that the function can be used to edit said spatial distribution profiles.

15. The semiconductor simulation method of claim 12, wherein after spatial distribution profiles of all materials introduced in a semiconductor device were output, a spatial distribution profile of a specified material in a semiconductor device is expressed as a function of a position coordinates, so that the function can be used to edit said spatial distribution profiles.

16. The semiconductor simulation method of claim 13, wherein after spatial distribution profiles of all materials introduced in a semiconductor device were output, a spatial distribution profile of a specified material in a semiconductor device is expressed as a function of position coordinates, so that the function can be used to edit said spatial distribution profiles.

17. The semiconductor simulation method of claim 1, wherein mutually different material constants or parameter values are assigned respectively to said same materials.

18. The semiconductor simulation method of claim 1, wherein one set selected from a group consisting of a set of different activation rates, a set of different diffusion coefficients, a set of different mobilities, a set of different material constants and a set of different parameter values is assigned independently to said same materials.

19. The semiconductor simulation method of claim 1, wherein different model equations which control the behavior of the material are assigned independently to said same materials.

20. A semiconductor simulation apparatus including a first simulator comprising:
   a material profile obtaining unit that handles same materials introduced to a same region at different processes as different materials.

21. The semiconductor simulation apparatus of claim 20, wherein said first simulator further including a geometry obtaining unit.

22. The semiconductor simulation apparatus of claim 20, further including second simulator for obtaining a device behavior of the semiconductor device employing a result of the first simulator.

23. A semiconductor simulation apparatus including a first simulator comprising:
   a material profile obtaining unit that handles same materials introduced to a same region under different conditions in a prescribed process out of a series of fabrication processes for said semiconductor device as different materials.

24. The semiconductor simulation apparatus of claim 23, wherein said first simulator further including a geometry obtaining unit.

25. The semiconductor simulation apparatus of claim 23, further including second simulator for obtaining a device behavior of the semiconductor device employing a result of the first simulator.

26. A memory for storing a program being executed on a semiconductor simulating apparatus, the program comprising the steps of:
   setting plural same materials introduced into a same region in the semiconductor device at different processes as mutually different materials; and
   handling said mutually different materials independently in the same region, to obtain spatial distribution profiles of said mutually different materials.

27. A memory for storing a program being executed on a semiconductor simulating apparatus, the program comprising the steps of:
   setting plural same materials introduced in a same region in the semiconductor device under different conditions in a prescribed process as mutually different materials; and
   handling said mutually different materials independently in the same region, to obtain spatial distribution profiles of said mutually different materials.

28. The semiconductor simulation method of claim 1, wherein said materials include an impurity atom and a point defect which occurred in semiconductor materials constituting said semiconductor device.

29. The semiconductor simulation method of claim 1, wherein a combination consisting of at least two sets selected from a group consisting of a set of different activation rates, a set of different diffusion coefficients, a set of different mobilities, a set of different material constants and a set of different parameter values are assigned independently to said same materials.

* * * * *